(12) United States Patent
Quenzer et al.

(10) Patent No.: US 8,517,545 B2
(45) Date of Patent: Aug. 27, 2013

(54) COVER FOR MICROSYSTEMS AND METHOD FOR PRODUCING A COVER

(75) Inventors: Hans Joachim Quenzer, Itzehoe (DE); Marten Oldsen, Hamburg (DE); Ulrich Hofmann, Itzehoe (DE)

(73) Assignee: Fraunhofer-Gesellschaft zur Foerferung der angewandten Forschung e.V., Munich (DE)

( * ) Notice: Subject to any disclaimer, the term of this patent is extended or adjusted under 35 U.S.C. 154(b) by 381 days.

(21) Appl. No.: 12/736,056

(22) PCT Filed: Feb. 13, 2009

(86) PCT No.: PCT/EP2009/001024
§ 371 (c)(1),
(2), (4) Date: Sep. 3, 2010

(87) PCT Pub. No.: WO2009/112138
PCT Pub. Date: Sep. 17, 2009

(65) Prior Publication Data
US 2010/0330332 A1 Dec. 30, 2010

(30) Foreign Application Priority Data
Mar. 4, 2008 (DE) .......................... 10 2008 012 384

(51) Int. Cl.
*G02B 5/00* (2006.01)
(52) U.S. Cl.
USPC ........................................................ 359/514
(58) Field of Classification Search
USPC .............. 359/507, 511, 514, 613; 438/64–67
See application file for complete search history.

(56) References Cited

U.S. PATENT DOCUMENTS

| | | | |
|---|---|---|---|
| 6,146,917 A | 11/2000 | Zhang et al. | |
| 6,743,656 B2 | 6/2004 | Orcutt et al. | |
| 6,951,119 B1 | 10/2005 | Quenzer et al. | |
| 7,579,622 B2 * | 8/2009 | Ouellet | 257/65 |
| 7,948,667 B2 | 5/2011 | Uchikawa | |
| 2005/0184304 A1 | 8/2005 | Gupta et al. | |
| 2005/0239228 A1 | 10/2005 | Quenzer et al. | |
| 2006/0176539 A1 | 8/2006 | Choi et al. | |
| 2007/0024549 A1* | 2/2007 | Choi et al. | 345/84 |

FOREIGN PATENT DOCUMENTS

| | | |
|---|---|---|
| EP | 1748029 A2 | 1/2007 |
| EP | 1400488 B1 | 4/2007 |
| WO | WO 01/38240 A1 | 3/2001 |
| WO | WO 2004/068665 A2 | 8/2004 |
| WO | WO 2007/069165 A2 | 6/2007 |

OTHER PUBLICATIONS

Pu et al., "Surface Micromachined Integrated Optic Polarization Beam Splitter", IEEE Photonics Tech Ltrs., vol. 10, No. 7, Jul. 1998, pp. 988-990.

(Continued)

*Primary Examiner* — Joseph P Martinez
(74) *Attorney, Agent, or Firm* — Jacobson Holman PLLC

(57) ABSTRACT

The cover according to the invention serves to encapsulate microsystems, wherein the cover comprises or is made of one or more cover units, and at least one cover unit comprises at least one first recess caused by deformation and bounded at least partially by at least one optical window, the quadratic surface roughness thereof being less than or equal to 25 nm. The invention further relates to a method for producing optical components, wherein the method is particularly also suitable for producing a cover according to the invention allowing encapsulation at the wafer level.

48 Claims, 15 Drawing Sheets

(56) References Cited

OTHER PUBLICATIONS

Chang et al., "Realization of Free-Space Optical Pickup Head With Stacked Si-Based Phase Elements", IEEE Photonics Tech Ltrs., vol. 17, No. 1, Jan. 2005, pp. 214-216.

Li et al., "Deep Reactive Ion Etching of Pyrex Glass Using $SF_6$ Plasma", Elsevier, Sensors and Actuators A87 (2001), pp. 139-145.

Lin et al., "Micro-Electro-Mechanical Systems (MEMS) for WDM Optical-Crossconnect Networks", IEEE.

Deegan et al., "Precision Glass Molding Technical Brief", Mar. 2007, pp. 1-17.

Yu et al., "Micromachined Fourier Transform Spectrometer on Silicon Optical Bench Platform", Elsevier, Sensors and Actuators A130-131 (2006), pp. 523-530.

Iliescu et al., "Deep Wet and Dry Etching of Pyrex Glass: A Review".

Bernd Bresseler, Der Werkzeugbau als Maß der Dionge, Mechanische Mikrobearbeitung, pp. 22-26, Mar. 2007.

* cited by examiner

COVER FOR MICROSYSTEMS AND METHOD FOR PRODUCING A COVER

This is a national stage of PCT/EP09/001024 filed Feb. 13, 2009 and published in German, which has a priority of German no. 10 2008 012 384.6 filed Mar. 4, 2008, hereby incorporated by reference.

TECHNICAL FIELD

Fully processed microsystems, typically micro-electro-mechanical systems (MEMS) and micro-opto-electro-mechanical systems (MOEMS)—such as accelerometers, angular rate sensors, or micromirrors—generally consist of very sensitive and in part freely movable microstructures (for example beams, grids, plates). During most of the production steps required for fabrication (for example layer deposition, photolithography, etching processes), even the movable microstructures are still rigidly, and thus immovably, attached to the substrate (carrier substrate), generally a wafer (carrier wafer). These microstructures first become freely movable through what is called a release process. From this point in time, the movable microstructures are especially delicate, so that contamination or mechanical overstress can lead to destruction or functional impairment of these microstructures, and thus to malfunction of the microsystem. Thus, for example, during separation of a wafer, which is to say the dicing of a wafer into individual chips, the wafer surface and hence the microstructures of the microsystems come into contact with particles and water. Moreover, the microstructures can be exposed to relatively severe mechanical stresses during a dicing process.

In order to nevertheless be able to manufacture microsystems economically with high yield, efforts are being made to carry out the release process as well as measures especially for protecting the movable microstructures as early as before the carrier substrate is separated or divided up.

An option that is frequently used for encapsulating microsystems consists of providing an appropriately structured cover that is attached to the carrier substrate and thus constitutes at least a part of the package.

The invention concerns a cover for encapsulating microsystems, in particular those which must fulfill an optical function, as well as a method for fabricating such a cover, in particular, wherein the method is also suitable for fabricating covers that can be used for encapsulating at the wafer level in particular, i.e. prior to the separation process and thus prior to dividing up the carrier substrate or carrier wafer.

PRIOR ART

Packages for encapsulating microsystems, customarily MEMS/MOEMS, and methods for fabricating such packages, in particular at the wafer level, so-called wafer level packaging processes, are known from the semiconductor industry.

As described in U.S. Pat. No. 6,743,656, for example, the wafer (carrier wafer) with the MEMS/MOEMS is attached to another wafer as cover (cover wafer) that has etched recesses of defined dimensions. As a general rule, the wafers are silicon wafers so that the recesses in the cover wafer can also be fabricated in a simple and precise manner with the proven methods of silicon technology. In the subsequent dicing process, typically a sawing process, separate encapsulated chips are then produced without the risk of contamination for the MEMS/MOEMS.

If the MEMS/MOEMS are to perform an optical function, or if specific parameters or physical quantities of the MEMS/MOEMS are to be optically measured—for example, determining deflection by means of an interferometer or through the analysis of video sequences—then an optically transparent cover is generally necessary.

In WO 2004/1068665, a wafer level packaging method for MOEMS is described that provides a cover made of glass. However, the wafer along with the MOEMS is diced before the encapsulation process. The resulting separate unencapsulated chips (dies) are placed on a new substrate, mounted, contacted, and are only then encapsulated. Recesses in the cover can be produced with prior art embossing and etching processes and/or through the use of spacers, for example made of silicon.

In U.S. Pat. No. 6,146,917, a wafer-level packaging method for MEMS/MOEMS is described in which a cover wafer of silicon or glass having recesses is joined to the carrier wafer by means of fusion bonding or anodic bonding, resulting in a hermetically sealed package. The necessary 50 to 150 µm deep recesses in the silicon cover wafer can be produced by wet chemical etching using a KOH solution.

US 2005/0184304 presents a wafer level packaging method for encapsulating micromirror arrays produced by surface micromachining. A cover wafer made of glass has recesses that serve as optical windows and can also have appropriate antireflection coatings. The recesses in the cover wafer can have depths of over 100 µm and are produced with common molding methods, such as, e.g., etching, casting, or embossing, or by the use of spacers.

Common to all the cited documents is that the optical windows of the cover are parallel to the substrate plane of the carrier substrate (carrier substrate plane), in particular the carrier wafer, and consequently to the MEMS/MOEMS located thereon. Also described in the prior art are covers with recesses bounded by optical windows that are angled relative to the plane of the carrier substrate.

Because of the difference in refractive index between the material of the optical windows, usually glass, and the ambient air, a portion of the incident radiation is reflected at the surfaces of the optical windows (FIG. 1a). In a variety of optical applications, for example in a micromirror for laser projection methods that is pivotably mounted with respect to the carrier substrate plane, undesirable reflections at the optical windows of the cover can interfere with the application and, for example, continuously swamp out the projected image information at stationary locations. Reflections cause problems especially when both the projected radiation and the reflections occur at the same angle (FIG. 1a). This situation exists especially when the range of angles used by, for instance, the micromirror, can assume a position in the operating range at which the mirror surface of the micromirror is oriented parallel to the optical windows of the cover.

As a rule, between 4-5% of perpendicular incident radiation is reflected at an optical window made of borosilicate glass without specially finished surfaces. Reflections can be sharply reduced by finishing the optical windows with suitable coatings or coating systems. While very low reflectances can be achieved for one wavelength used, this effort is by its nature subject to limitations when a broad spectrum of radiation or radiation having different wavelength components is used. A reduction of the remaining reflections below 0.1% is only possible at considerable expense. In the case of a single-axis micromirror, for example, only a small spacing is present between the reflections and the projected or deflected radiation or ray as a result of the relatively small geometric spacing between the mirror surface and the surfaces of the optical windows. The use of stop structures is possible, but requires precise adjustment, especially since the incident and projected radiation typically have diameters in the range of a millimeter. In the case of a two-axis micromirror, in contrast, the reflections are always located within the projection range and cannot be masked by the introduction of additional structures.

Accordingly, as described in WO 2007/069165, an additional reduction in the reflections that fall in the projection or image region can be achieved by angled optical windows.

In US 2006/0176539A1, a cover geometry is described for packaging at the chip level in which a separation of the reflection region and projection region (reflection masking) is achieved by angling the optical windows with respect to the carrier substrate plane and thus with respect to the mirror surface of the micromirror. A use of the described cover for encapsulating MEMS/MOEMS at the wafer level is not practicable. The recesses in the cover are produced by conventional etching methods.

An advancement is described in US 2007/0024549A1. According thereto, covers can also be produced that allow for encapsulation at the wafer level. The molding of the cover or the implementation of the necessary recesses is accomplished with known embossing and molding methods.

Such molding methods include deep drawing of glass and pressing blanks, for example. Blank pressing, in particular, is also used for the manufacture of optical components, such as lenses (see Bernd Bresseler, "Mikroproduktion-Der Werkzeugbau als Mass der Dinge" at the Internet address http://www.aixtooling.de/index.html?content=/deutsch/aktuelles/aktuelles.html, and John Deegan Rochester Precision Optics, "Precision Glass Molding Technical Brief", at the Internet address http://www.rpoptics.com/Precision%20Glass%20Molding%20Technical%20Brief_2.pdf).

Optical components that have flat or plane parallel surfaces, such as mirrors or partially reflecting mirrors and beam splitters, are customarily made of silicon in microsystem engineering (documents: Chuan Pu, Zuhua Zhu and Yu-Hwa Lo, "Surface Micromachined Integrated Optic Polarization Beam Splitter," IEEE PHOTONICS TECHNOLOGY LETTERS, Vol. 10, No. 7, JULY 1998, and Lih Y. Lin and Evan L. Goldstein, "Micro-Electro-Mechanical Systems (MEMS) for WDM Optical-Crossconnect Networks," IEEE 1999). Thus angled mirrors can be implemented, for instance with anisotropic wet chemical etching processes, using KOH for example (document: Jenq-Yang Chang, Chih-Ming Wang, Chien-Chieh Lee, Hsi-Fu Shih and Mount-Learn Wu, "Realization of Free-Space Optical Pickup Head With Stacked Si-Based Phase Elements," IEEE PHOTONICS TECHNOLOGY LETTERS).

In the document by Kyounggsik Yu, Daesung Lee, Uma Krishnamoorthy, Namkyoo Park and Olav Solgaard, "Micromachined Fourier transform spectrometer on silicon optical bench platform," Sensors and Actuators A130-131 (2006), 523-530, microoptical beam splitters and angled mirrors are likewise produced by means of various etching methods, with reference being made to high quality, in particular low surface roughness, of the optically functional surfaces. Using wet KOH etching, surfaces having a root mean square roughness of less than 20 nm can be achieved. However, in standard silicon wafers such surfaces can only be realized with certain angles of inclination, which are determined by silicon's crystal structure.

The use of etching methods to fabricate corresponding optical components on the basis of glass, such as borosilicate glass, generally results in surfaces whose roughness is not satisfactory for optical applications (see the documents Xinghua Li, Takashi Abe, Masayoshi Esashi, "Deep reactive ion etching of Pyrex glass using $SF_6$ plasma," Sensors and Actuators A87, 2001, pp. 139-145, and Ciprian Iliescu, Kwong Luck Tan, Francis E. H. Tay, Jianmin Miao, "Deep Wet and Dry Etching of Pyrex Glass: A Review").

Description

Consequently, the object of the present invention is to overcome the disadvantages of the prior art and to provide a cover that ensures sufficient space and/or freedom of movement for the microsystems to be encapsulated, and also ensures the least possible adverse effect on the transmitted radiation. An additional object is to provide a method for fabricating an inventive cover or fabricating optical components with displaced and/or angled regions and high surface quality.

According to the present invention, the object is attained by a cover according to claim 1. Claim 18 specifies a method for fabricating optical components, in particular a cover according to the invention. The dependent claims teach advantageous refinements; claims 46 through 47 specify advantageous uses.

In general, a cover for encapsulating microsystems should, at the least, provide protection against contaminants and at the same time should not impair the mechanical and/or optical functionality of the microsystems. If the functionality of the microsystems is not to be limited to movements in or parallel to the plane of the carrier substrate, but is also to provide movements perpendicular to the plane of the carrier substrate, a cover must generally ensure appropriate freedom of movement for the microsystems.

An inventive cover for microsystems has or consists of one or more cover units, wherein at least one cover unit has at least one recess produced by deformation that is at least partly bounded by at least one optical window whose root mean square surface roughness is less than or equal to 25 nm.

The cover according to the invention serves to cover or encapsulate microsystems that preferably have dimensions in the millimeter, micrometer and/or nanometer range. Within the scope of the invention, microsystems are understood to mean micromechanical systems (MEMS), micro-opto-electro-mechanical systems (MOEMS), and/or microcomponents, in particular.

According to the invention, a cover unit is understood to mean a cover or the part of a cover that represents the smallest unit required for encapsulation. For example, in semiconductor technology the smallest unit for encapsulation is called a die, wherein a die is typically obtained by dicing a wafer. Accordingly, a cover unit would encapsulate one die. At the wafer level in particular, covers are frequently used which have multiple cover units or consist of multiple cover units. Thus the inventive cover is preferably composed of multiple cover units, in particular a two-dimensional array of cover units. By joining the cover to the carrier substrate, a plurality of microsystems can thus be encapsulated simultaneously. In the separation step that follows, for example a sawing step, the individual encapsulated regions of the carrier substrate are divided up, in which process the cover is accordingly separated into the individual cover units as well. Accordingly, the inventive cover is preferably designed as a single piece and correspondingly has no joints that result from joining multiple parts by a material-to-material, frictional, and/or interlocking process. The elimination of the joining and adjustment processes saves effort and costs. Coating layers applied to the cover do not require any deviation from single-piece design.

Preferably the cover, in particular every cover unit, has contact areas. Contact areas are certain areas of the cover that are intended to ensure a stable connection between the carrier substrate and the cover. The contact areas of the cover are preferably designed such that they permit a hermetically sealed connection with the carrier substrate and thus a hermetically sealed encapsulation from the environment. Contamination and a resultant destruction or functional impairment of the microsystems are prevented in an especially effective manner by hermetically sealed encapsulation. Moreover, such an encapsulation makes it possible to establish a specific atmosphere within the encapsulation. To this end, it is especially preferred for the contact areas to be arranged in the shape of a frame so that, once brought into contact with the carrier substrate, they surround the microsystems to be encapsulated. Preferably, only one microsystem is encapsulated with one cover unit. In some cases, however, it may be necessary to encapsulate multiple microsystems with one cover unit.

At least one cover unit, preferably every cover unit, has at least one first recess produced by deformation. In this way space needed for the encapsulation, for example on account of the dimensions and/or the movements of the microsystems, can be made available. In particular, the first recess can ensure appropriate freedom of movement for the microsystems, whose functionality is not restricted to movements in or parallel to the plane of the carrier substrate, but also provides for movements perpendicular to the plane of the carrier substrate.

The first recess is not produced by removal of material, in particular cover material, and hence is not produced by an etching step, fir example. In contrast to dry-etched recesses, for example in glass, the surfaces bordering the first recess (boundary surfaces) have a relatively low root mean square surface roughness. This results in minimal influence of the cover on the transmitted radiation, which is advantageous for optical applications in particular.

In addition, the first recess can have aspect ratios of maximum recess depth to maximum recess width of greater than or equal to 0.5, in contrast to isotropically etched recesses in which the root mean square surface roughness of the boundary surfaces increases with increasing recess depth. As a result, smaller lateral dimensions of the first recess are possible for the same depth. Another advantage of the first recess as compared to etched recesses is that maximum depths greater than or equal to the maximum material thickness of the cover are possible. This makes it possible to save material and costs, since the same required depth does not demand as thick a starting substrate for the cover.

The first recess is at least partly bounded by at least one optical window whose root mean square surface roughness is less than or equal to 25 nm. On account of the low root mean square surface roughness of the optical window, electromagnetic radiation transmitted through the cover is scattered less, which makes the inventive cover suitable for optical applications in particular. It is especially preferred for the first recess to be bounded by surfaces having the same root mean square surface roughness as the optical window. This makes it possible to reduce contamination of the encapsulated microsystems by particles released or breaking off from the cover, for example as a result of mechanical stresses.

Preferably each cover unit has one or more optical windows. It is especially preferred for the inventive cover to have a two-dimensional array of optical windows. This makes it possible to encapsulate a plurality of microsystems, in particular the microsystems of an entire wafer, at the same time in just one encapsulation step, saving time and costs.

According to the invention, an optical window is understood to mean a region of the inventive cover that is permeable, in particular transparent, for any desired wavelengths and/or wavelength ranges of electromagnetic radiation—preferably the radiation to be processed by the microsystem to be encapsulated and thus the radiation used in the application—from the infrared wavelength region, the wavelength region visible to humans (light), and the ultraviolet wavelength region, and, in addition, that satisfies high quality requirements for surface roughness, flatness, and plane parallelism, in particular. Moreover, these regions should preferably have a homogeneous material structure in order to avoid undesired refractions and/or deflections of the radiation. The surfaces of the optical window through which the radiation used in the application enters and/or is coupled back out of the optical window constitute the transmission surfaces of the optical window.

One parameter for evaluating surface quality is root mean square surface roughness. This should be as low as possible for the optical windows. In order to satisfy the high quality requirements for surface roughness, the at least one optical window, and in particular its transmission surfaces, has a root mean square surface roughness of less than or equal to 25 nm. Preferably the at least one optical window, and in particular its transmission surfaces, has a root mean square surface roughness of less than or equal to 15 nm, especially preferably less than or equal to 5 nm. The scattering caused by the cover, which can lead to a reduction in the contrast ratio or the signal-to-noise ratio of the transmitted optical signal, for example, can be reduced in this way.

Preferably the at least one optical window is displaced, in particular is displaced out of the base plane of the cover in a parallel manner, and/or is angled with respect to the base plane of the cover. By this means, the optical windows can be arranged with nearly any desired spacings and/or angles of inclination relative to the microsystems to be encapsulated, making the cover flexible in its application. Thus, the requisite freedom of movement can be provided by displaced optical windows to the microsystem to be encapsulated, without the use of additional layers or structures as spacers. In this context, the base plane of the cover is defined by the contact areas (FIG. 2d) or by the surfaces of the cover (FIG. 2e) opposite the contact areas of the cover, in particular opposite and parallel thereto. After the joining of the cover to the carrier substrate, the carrier substrate plane and the base plane of the cover are usually parallel to one another.

Preferably, the inventive cover serves to encapsulate at least one micromirror that is pivotably mounted with respect to the carrier substrate plane, wherein at least one of the optical windows is designed to be angled with respect to the carrier substrate plane after the cover is joined to the carrier substrate. Preferably, all optical windows of the inventive cover are designed to be angled with respect to the base plane of the cover, and thus with respect to the carrier substrate plane once the cover has been brought into contact with or joined to the carrier substrate. Using an angled optical window, for instance with a pivotably mounted micromirror, a separation of the reflection region and projection region (reflection masking) can be achieved, by which means it is possible to reduce or prevent an adverse effect on the projected radiation or on the projected signal from swamping-out caused by reflections. Preferably, the angle of inclination of at least one optical window angled with respect to the plane of the carrier substrate is greater than the maximum pivot angle of the operating range of the micromirror that is pivotably mounted with respect to the plane of the carrier substrate. If the micromirror has a pivot angle operating range of between −15° and +15°, for example, and if the angled optical window is angled by 15° with respect to the mirror surface of the undeflected micromirror, and hence with respect to the plane of the carrier substrate, then the reflections of the radiation striking the angled optical window at 15° with respect to the surface normal of the plane of the carrier substrate, and hence perpendicular to the angled optical window, are sent back in the direction of incidence, and thus do not fall into the projection region, as is evident from FIG. 1b. Due to the inclination of the incident beam at 15° with respect to the surface normal of the plane of the carrier substrate and an operating range of the micromirror between −15° and +15° with respect to the plane of the carrier substrate, the projected image appears in an optical angular range between +15° and −45°. As a result, the projection range encompasses an optical angular range (scan range) of nearly 60°. Accordingly, the angle of inclination of the angled optical window is preferably greater than or equal to 15°.

Preferably the inventive cover is made of a material or a material composition that has a coefficient of thermal expansion that differs as little as possible from the coefficient of thermal expansion of the carrier substrate. In this way, it is possible to decrease thermally induced mechanical stresses between the carrier substrate and the cover, which can be especially severe when—as is the case in anodic and thermal bonding—there are relatively large differences between process temperature and ambient or operating temperature, and to reduce the risk of damage to the cover and/or carrier substrate, or the encapsulated microsystems.

The inventive cover should be permeable, at least in sections, normally in its entirety, to the electromagnetic radiation used in the application. In most optical applications, however, the highest possible transparency thereof is required for the regions that are permeable to the electromagnetic radiation used in the application, so that a laser beam, for example, reaches the microsystem as unaffected as possible.

Accordingly, the inventive cover contains glass and/or a glass-like material, at least in sections, or the inventive cover is made of glass and/or a glass-like material.

According to the invention, glass-like materials are understood to mean substances that resemble glasses on account of their thermodynamic properties (amorphous structure, glass transition temperature), even though their chemical composition differs from that of the silicate glasses. Noted here as examples are the synthetic glasses or organic vitroids known in chemistry, such as polymethyl methacrylate (PMMA), polycarbonate, and polystyrene.

Especially suitable glasses are silicate glasses, in particular borosilicate glasses, since borosilicate glasses are very chemical-resistant and temperature-resistant. The temperature resistance and insensitivity of borosilicate glasses to sudden temperature fluctuations are a result of their low coefficient of thermal expansion. Moreover the transmissivity, in particular in the wavelength region visible to humans, is very high at over 90%.

The maximum dimension of the inventive cover is preferably greater than or equal to 80 mm, in particular greater than or equal to 150 mm. In an advantageous embodiment, the inventive cover is based on a substrate in the form of a wafer, for example a glass wafer, in which the first recesses are provided and that has multiple cover units. In this way, a plurality of microsystems, which are located, for example, on a carrier wafer made of silicon, can be encapsulated simultaneously with one cover. Preferably the cover has the same lateral dimensions as the carrier wafer—corresponding to a wafer diameter of, e.g., 150 mm (6 inches), 200 mm (8 inches), or 300 mm (12 inches), by which means a material-optimized and hence effective encapsulation can be ensured. It is especially preferred for the cover to have maximum dimensions greater than 300 mm. In this way, it is possible to encapsulate even substrates with correspondingly large dimensions while simultaneously ensuring a high optical quality of the cover.

Preferably the transmission surfaces of the at least one optical window are designed to be flat (planar) and/or plane parallel to one another. In order to satisfy quality requirements, the transmission surfaces of the at least one optical window of the inventive cover preferably have a flatness and/or plane parallelism deviation less than one fourth the wavelength of the electromagnetic radiation used in the application, wherein it is especially preferred for wavelengths from the ultraviolet to the infrared wavelength region (for example, between approximately 200 nm and approximately 15 μm) to be used. Accordingly, in the case of light having a longer wavelength, for example with a wavelength of 720 nm, values for the flatness and/or plane parallelism deviation of less than 180 nm are advantageous. When shorter wavelength light, with wavelengths below 440 nm, is used, the requirements for the transmission surfaces become more stringent, so that values for the flatness and/or plane parallelism deviation of less than 110 nm are preferred. The optical windows of the inventive cover that are angled in design, in particular, preferably have a flatness and/or plane parallelism deviation of the transmission surfaces of less than one fourth the wavelength of the electromagnetic radiation used in the application. Preferably the angled optical windows likewise have a flatness and/or plane parallelism deviation of the transmission surfaces of less than or equal to 180 nm, especially preferably less than or equal to 110 nm. Optical windows that fulfill these requirements produce fewer deviations and a smaller beam widening of the optical path, resulting in reduced errors in the optical signals.

The values for the flatness and plane parallelism deviation, and for the root mean square roughness, were ascertained using interferometric measurement methods. The MicroMap 512, a white light and phase interferometer manufactured by Atos, was used for the measurements.

To optimize the properties of the inventive cover, it is advantageous for the inventive cover—in particular the transmission surfaces of the optical windows—to be provided at least in part with at least one coating and/or functional surface structures.

Coatings that are used by preference are antireflection coatings, which further reduce reflections at the inventive cover, in particular the optical windows, hence further reducing radiation losses. Such antireflection coatings can be implemented with coating systems made of magnesium fluoride and titanium oxide, or silicon dioxide and titanium oxide, for example.

In addition, antistatic coatings, which minimize an electrical charging of the cover, are preferably used. A material that is especially suitable for antistatic coatings in optical applications is ITO (indium tin oxide), since it has a high electrical conductivity when doped, and has high transparency over a wide wavelength range.

Additionally, it can be advantageous for reflective coatings, for example metal layers, to be applied as coatings that, after structuring, form locally reflective regions, for example in order to spatially delimit an incident light beam (stop function) or to form a static reflecting mirror in proximity to the optical windows.

Additional coatings that it is preferable to use are absorption coatings, which absorb electromagnetic radiation of certain wavelengths or entire wavelength ranges.

Within the scope of the invention, functional surface structures are geometric modifications of the surface in the micrometer and/or nanometer range, permitting certain surface characteristics to be influenced selectively. Thus, by the preferred use of moth-eye structures (see document: D. G. Stavenga, S. Foletti, G. Palasantzas, K. Arikawa, "Light on the moth-eye corneal nipple array of butterflies," Proceedings of the Royal Society B (2006) 273, 661-667, doi: 10.1098/rspb.2005.3369, published online 6 Dec. 2005), whose structural dimensions lie below the wavelength of the radiation used in the application, the refractive index of a boundary layer—such as exists between a glass surface and the air surrounding it—can be decreased, which is why moth-eye structures are suitable for rendering surfaces antireflective. Such antireflection treatment is advantageous especially when a coating proves to be unsuitable for reasons of adhesion.

The inventive method for fabricating optical components has the following steps:
  providing a first substrate,
  producing a stack by applying at least one layer to the first substrate,
  structuring the at least one layer to produce at least one reinforcing element,
  providing at least one second substrate,
  bringing the at least one second substrate into contact with the stack,
  heating and deforming the first substrate in such a manner that at least one region of the first substrate covered by the at least one reinforcing element is displaced and/or inclines.

The inventive method serves to produce optical components in which certain regions or surfaces are designed to be angled and/or displaced with respect to the substrate planes. The optical component has at least one optical element, e.g. such as an optical window, a mirror or partially reflecting mirror, a beam splitter, and/or an interference filter, or the optical component is composed of at least one optical element. The optical component is preferably a cover with one or more optical windows.

Preferably the inventive method is used to produce an inventive cover according to claim 1, wherein the inventive cover is suitable for encapsulating microsystems which in particular must fulfill an optical function and customarily are applied to or located on a carrier substrate. Often a silicon wafer is used as the carrier substrate on which the microsystems to be encapsulated are produced by surface micromachining or volume micromechanical processes.

The first substrate constitutes the starting or base substrate for the optical component. Accordingly, the same applies to the material or material composition and surface characteristics, such as roughness, flatness, and plane parallelism of the substrate planes, as already explained with regard to the inventive cover. Accordingly, both substrate sides of the first substrate are preferably polished to ensure high surface quality.

Preferably, the first substrate contains glass and/or a glass-like material, at least in sections, or the first substrate is made of glass and/or a glass-like material. Especially suitable glasses are silicate glasses, in particular borosilicate glasses.

In the next step, a stack is produced by applying at least one layer to the first substrate. The at least one layer can be applied to the first substrate by means of deposition methods, for example, and/or the at least one layer is implemented through the use of at least one additional substrate. The at least one layer preferably is made of a semiconducting material or preferably contains a semiconducting material, at least in sections. It is especially preferred to use silicon layers, in particular polysilicon layers, and/or a semiconductor wafer as additional substrate, preferably a silicon wafer, in order to be able to make use of the mature and quite controllable processes of semiconductor technology, in particular silicon technology.

When the at least one layer is applied to the first substrate, the first substrate and the at least one layer are preferably joined material-to-material to one another, in order to ensure high positional stability of the at least one layer with respect to the first substrate. In general, all appropriate techniques may be used for this purpose, for example deposition, gluing, soldering, or bonding.

It is useful for application of the at least one layer to the first substrate to take place in such a way that a displacement and/or twisting of the at least one layer with respect to the first substrate is reduced or prevented.

In an advantageous embodiment of the method, a polysilicon layer is applied to the first substrate by means of CVD, in particular hot wire CVD, as the at least one layer. Since the process temperatures in this deposition method are below 500° C., preferably between 300° C. and 400° C., even relatively temperature-sensitive substrates can be coated with it.

In another preferred embodiment, the at least one layer, for example a silicon wafer, is applied or joined to the first substrate by anodic bonding and/or thermal bonding. In the semiconductor industry in particular, these bonding methods are frequently used joining techniques that produce stable bonds.

Preferably the at least one layer has at least one second recess, at least on the side of the layer that is joined to the first substrate. This second recess is intended to prevent contact between the first substrate and the at least one layer in certain regions of the first substrate during application, in order to protect the surface quality of the first substrate in these regions for additional joining and/or contacting steps. Such regions to be protected are, in particular, the regions of the first substrate that are not provided with reinforcing elements. The second recesses in the at least one layer preferably have depths of about 0.5 µm to about 1 µm.

In the next method step, structuring of the at least one layer to produce at least one reinforcing element is carried out in such a way that deformation of the regions of the first substrate functioning as optical windows is reduced or prevented. This is accomplished, in particular, by the means that the at least one layer at least partially covers the regions of the first substrate functioning as optical windows. The additional material of the reinforcing elements stabilizes and protects the covered regions of the first substrate, and opposes a deformation. In this way, the preferably existing good flatness, plane parallelism, and low surface roughness in the prepared first substrate can be preserved, which is the foundation for high-quality optical windows and, in addition, for attaining surfaces with high surface quality—especially transmission surfaces—that are not accessible for subsequent processing (for example a polishing step).

Preferably, moreover, at least one fixing element is produced which reduces or prevents a displacement and/or twisting of the at least one reinforcing element with respect to the first substrate after the stack has been brought into contact with the at least one second substrate, thus improving the positional stability of the reinforcing elements. In the subsequent process step of bringing the stack into contact with the at least one second substrate, the fixing elements are preferably clamped between the stack and the at least one second substrate. The provision of suitable receiving grooves, for example in the at least one second substrate, makes it possible to ensure an appropriate contact between the stack and the at least one second substrate in spite of the interposed or clamped fixing elements.

Preferably the reinforcing elements and the fixing elements stand in direct connection with one another in order to achieve the most stable possible force coupling.

In another preferred embodiment, one or more support structures are created, wherein the creation of the support structures takes place such that the support structures protect the support regions, in particular the support surfaces, of the first substrate, and/or function as spacers between the first substrate and the at least one second substrate.

The support regions are the regions of the first substrate that do not experience any deflection during the method, in particular through deformation, or are directly or indirectly supported by the at least one second substrate. Direct support is present when the first substrate and the at least one second substrate are brought into contact with one another. In indirect support, layers or layer sequences are located between the first substrate and the at least one second substrate, for example. The support surfaces are the surfaces of the support regions, especially the surfaces that face the at least one second substrate. In the case of an inventive cover to be produced, the support surfaces of the first substrate preferably constitute the contact areas, and thus the areas of the inventive cover that are provided for contact or joining of the inventive cover with the carrier substrate.

The support structures are preferably implemented through layers or layer sequences which are applied to or arranged on the first substrate and/or the at least one second substrate. The spacing between the first substrate and the at least one second substrate can be adjusted by varying the thicknesses of the layers or layer sequences, so that the support structures preferably function as spacers.

The at least one support structure and/or the at least one fixing element are preferably created in the same process step as the at least one reinforcing element through the structuring of the at least one layer, by which means time-saving and economical fabrication is achieved, and/or in one or more additional process steps before the stack is brought into contact with the at least one second substrate, thus permitting flexible fabrication. The support structures and/or fixing elements are part of the stack, regardless of the method of creation.

Preferably at least one of the reinforcing elements is arranged on each of the two substrate sides of the first substrate, wherein opposing reinforcing elements preferably overlap at least partially. In an especially advantageous embodiment, such reinforcing elements overlap completely (FIG. 3c). In this way, the regions of the first substrate that they cover are particularly well stabilized and protected against deformation.

Preferably at least one of the reinforcing elements is arranged such that an inclination of the region(s) of the first substrate covered by this/these reinforcing element(s) is assisted during heating and deformation. This is achieved, in particular, by the means that at least one of the reinforcing elements is located off-center in the deflection region of the first substrate. Deflection regions are the unsupported regions of the first substrate that are located between the contact regions. A deflection region can be subdivided into the regions of the first substrate covered by the reinforcing elements and the deformation regions of the first substrate. The deformation regions, in turn, represent the regions of the first substrate that, by their change in shape, ensure a deformation, in particular a displacement and/or inclination of the regions of the first substrate covered by the reinforcing elements.

An off-center arrangement of the reinforcing elements in the deflection region makes it possible to achieve a resultant torque that, with a uniform distribution of force over the reinforcing elements, acts on the regions of the first substrate covered by the reinforcing elements, and hence favors an inclination of the regions of the first substrate covered by the reinforcing elements.

Within the scope of the invention, an off-center arrangement of a reinforcing element in the deflection region is understood to mean that the reinforcing element does not have spacing of equal size in at least one direction from all contact regions adjacent to the deflection region.

Accordingly, it is the case for an off-center force on the deflection region that the spacing of the point of action of the force is not of equal size in at least one direction from all contact regions adjacent to the deflection region. For an off-center force on the reinforcing element, the spacing of the point of action of the force is not of equal size in at least one direction from the edges of the reinforcing element.

After the provision of at least one second substrate, this second substrate is brought into contact with the stack.

Preferably the at least one second substrate contains a semiconducting material, at least in sections, or the at least one second substrate is made of a semiconducting material. Semiconductor wafers in particular, preferably silicon wafers, are used as the second substrate, so that the mature and quite controllable processes of semiconductor technology, in particular silicon technology, can be used.

The at least one second substrate—in particular the regions of the at least one second substrate that are brought into contact with the stack—preferably contains or is made from materials that are resistant to high temperatures, in particular graphite. Due to the low wear or low abrasion, such substrates can be used multiple times or reused.

Preferably, the at least one second substrate has at least one third recess, which is preferably formed on the substrate side of the second substrate that is brought into contact with the stack. The third recesses of the second substrate preferably have a depth between approximately 100 µm and 1000 µm, especially preferably a few millimeters, so that deflections of the first substrate resulting from deformation, and thus in particular the depths of the first recesses, can be varied over a wide range.

The stack is preferably brought into contact with the at least one second substrate such that cavities are formed between the second substrate and the stack by the third recesses in the second substrate and/or by the support structures. In a preferred embodiment, these cavities enclose the reinforcing elements that face the second substrate.

Because of the cavities, contact between the reinforcing elements and the second substrate before the heating can be prevented. Contact of the reinforcing elements and/or the first substrate in the deflection regions with the second substrate before the heating can result in adhesion of the reinforcing elements and/or the first substrate in the deflection regions, and can prevent or impede deformation-caused deflection, in particular displacement and/or inclination, of the regions of the first substrate covered by the reinforcing elements.

Furthermore, a pressure that is above or below the ambient pressure, in particular atmospheric pressure, can be created in the cavities. Since the cavities are bounded by at least sections of the deflection regions of the first substrate, a pressure that is above or below the ambient pressure can produce force actions to assist the deformation process.

The ambient pressure preferably corresponds to atmospheric pressure, and the pressures in the cavities are then preferably between approximately 750 mbar and approximately 900 mbar or between approximately 1200 mbar and approximately 1350 mbar, and can be produced by means of a vacuum pump, for example.

Furthermore, it can be advantageous when the bringing of the at least one second substrate into contact with the stack results in a joining, in particular a material-to-material joining. By this means, cavities, which are preferably hermetically sealed from the environment, are created between the stack and the second wafer. Specific pressure levels can be produced in the cavities in that the joining process is carried out at specific pressures. Preferably, the pressure levels during the joining process, for example anodic bonding at 400° C., are between approximately 500 mbar and approximately 600 mbar or between approximately 800 mbar and approximately 900 mbar. Since the subsequent heating process typically takes place at significantly higher temperatures than the joining process—preferably the first substrate is brought to a temperature between approximately 750° C. and approximately 900° C. during the method step of heating and deformation—the higher temperatures result in pressures in the cavities of approximately 750 mbar to approximately 900 mbar or from approximately 1200 mbar to approximately 1350 mbar as a result of the aforementioned pressure ranges. Since the cavities are preferably hermetically sealed from the environment, these pressures are maintained for a relatively long period of time, and thus in particular for the subsequent deformation or molding step, without the supply of additional energy, for example to operate a vacuum pump. The joining of the stack and the second substrate is preferably carried out by means of anodic bonding and/or thermal bonding.

In the molding of the first substrate, particular use is made of the flow characteristics of the first substrate, especially those present in the vicinity of and above the softening temperature (softening point) and/or the melting point. The primary advantage of this type of molding over other molding or embossing methods, such as deep drawing of glass or glass embossing (for example blank pressing) is that it is possible to achieve optical components in particular, e.g., with substrate or wafer dimensions, in particular substrate or wafer diameters, greater than or equal to 80 mm, in particular greater than or equal to 150 mm, and especially preferably greater than or equal to 300 mm, with high surface quality, in particular low surface roughness, high surface flatness, and high plane parallelism of the surfaces. Especially when the starting substrate is made of glass, the surface of the optical components is frequently unsatisfactory. The molded substrates, in the case of deep drawing of glass for example, are roughened and cannot satisfy the requirements for, e.g., an optical window. With blank pressing, the maximum extent or dimensions of the optical components that can be fabricated are severely limited. Furthermore, this embossing method requires very high-quality, durable, and thus costly embossing tools, restricting flexible fabrication.

In the method step of heating and deformation, the first substrate, at least the deformation regions of the first substrate, is preferably brought to a temperature that is between 150° C. below and 100° C. above the softening temperature of the material of the deformation regions, in particular between approximately 750° C. and approximately 900° C. In the vicinity of the deformation temperature, the material of the deformation regions has especially favorable properties, in particular with regard to viscosity. After or even during the heating process, the first substrate is deformed by a force or the action of a force on the deflection region in the deformation regions. When borosilicate glass, with a softening temperature of approximately 820° C., is used, temperatures between approximately 750° C. and approximately 900° C. are useful.

The softening temperature or softening point, also known as the Littleton temperature or Littleton softening point, is determined according to a Littleton method. In this process, a material fiber (for example, a glass fiber) with a diameter of 0.65 mm to 1.0 mm and a length of 22.9 cm is hung in an oven of a specific design. The lower end of the fiber hanging out of the oven is observed at a heating rate of 5 to 10 K/min. With increasing temperature, the fiber elongates under its own weight. The temperature at which the elongation is 1 mm/min is called the Littleton temperature. Most glasses or glasslike materials have a viscosity of approximately $10^{-7.6}$ dPa-s at this temperature (Scholze, Horst "Glas-Natur, Struktur and Eigenschaften," $3^{rd}$ edition, Springer Verlag, p. 151).

The process step of heating and deformation is preferably carried out in a time-controlled manner or until contact of the first substrate and/or the reinforcing elements with a deflection limiter, which limits the maximum desired deflection resulting from deformation, for example. The at least one second substrate, in particular the floors of the third recesses, can serve as the deflection limiter, for example.

The deformation of the first substrate or the deformation regions can preferably be caused by the dead weight of the reinforcing elements and the regions of the first substrates covered by them and/or by an externally applied force.

An externally applied force can usefully be based on a mechanical and/or magnetic and/or electrical and/or piezoelectric interaction.

In a preferred embodiment, the externally applied force is caused by a pressure difference between the two substrate sides of the first substrate, particularly in the deflection region. With this method of force application, as in the case of deformation by dead weight, the stack, in particular the first substrate, must not come into contact with another object; this prevents reduction in the quality of the surfaces of the first substrates, for example by an embossing tool.

Moreover, in this case the process step of heating and deformation can be carried out until a volume change of the cavities caused by the molding of the first substrate has led to the pressure in the cavities being equal to the ambient pressure.

Specially designed molding devices are also suitable for applying a force.

The applied force can act either centered or off-center with regard to the reinforcing elements and/or the deflection region. For example, a force profile uniformly distributed over the deflection regions results in a force that is centered with regard to the deflection region, by which means a displacement of the covered regions of the first substrate can be achieved with a centered arrangement of the reinforcing elements in the deflection regions. In this case, an inclination of the regions of the first substrate covered by the reinforcing elements can be achieved by an off-center arrangement of the reinforcing elements in the deflection regions (FIG. 3d).

With a centered arrangement of the reinforcing elements in the deflection regions, an inclination of the regions of the first substrate covered by the reinforcing elements can be achieved by applying a force that is off-center with regard to the reinforcing elements. The combination of an off-center arrangement of the reinforcing elements with a force that is off-center with regard to the reinforcing elements is especially advantageous and effective for ensuring an inclination.

So as to ensure the most trouble-free deformation-caused deflection possible, the stack should if possible have no contact with the at least one second substrate. A contact could impede or even prevent a deformation-caused deflection of the first substrate as a result of adhesive or contact forces. Preferably, the surfaces of the reinforcing elements, the first substrate, and/or the second substrate are prepared in the deflection regions such that a joining between the stack and the second substrate is prevented in the deflection regions. This can be accomplished through various coatings and/or methods of surface modification that contribute to reducing contact forces. Suitable coating materials include platinum, NiAl alloy (e.g., an alloy of 50% Ni and 50% Al), graphite, and boron nitride, for example.

Especially when the at least one layer or the reinforcing elements and/or support structures and/or fixing elements have no other function, they are preferably at least partially removed in an additional method step. For certain applications, however, it may be advantageous for parts of the reinforcing elements to remain on the first substrate or the finished optical component, for example as frame-shaped stabilizing structures or stop structures.

The at least one second substrate is also preferably completely removed after the deformation. In some cases the microsystems to be encapsulated are located on the second substrate, however, so that retaining the connection between the stack and the second substrate can be quite useful.

In an advantageous embodiment, at least sections of the first substrate are provided with at least one coating—in particular, with an antireflection coating, an antistatic coating, a reflective coating and/or an absorption coating, and/or with functional surface structures, by which means the functionality of the optical components can be improved. Concerning coatings and functional surface structures, reference is made to the above discussion of the inventive cover.

Moth-eye structures can be produced on the surface of the first substrate, especially in the vicinity of the optical windows, for example by embossing methods, after the molding of the first substrate. However, the embossing of such structures in angled and/or displaced surfaces is extremely problematic. Moth-eye structures can be fabricated, particularly on angled surfaces, by exploiting the flow characteristics of the first substrate.

Accordingly, in a preferred embodiment moth-eye structures are produced as functional surface structures such that, prior to the application of the at least one layer to the first substrate, at least the side of the at least one layer that is brought into contact with the first substrate is provided with a negative mold of the moth-eye structures, and, after the application of the at least one layer on the first substrate, the moth-eye structures are created on the first and/or second substrate sides of the first substrate during the molding of the first substrate by the means that the negative mold in the at least one layer is molded onto the first and/or second substrate sides of the first substrate, in particular onto the transmission surfaces of the optical windows. In this process, the first substrate flows into the hollow molds defined in the at least one layer by the negative mold, resulting in the appropriate surface geometry. The molding of the first substrate and the creation of the moth-eye structures can also be separated in time or take place sequentially in independent steps.

In another preferred embodiment, the coating is created such that, prior to the application of the at least one layer to the first substrate, at least the side of the at least one layer that is brought into contact with the first substrate is provided with the coating, and subsequently the joining between the first substrate and the at least one layer is produced by a joining between the coating and the first substrate, or such that, prior to the application of the at least one layer to the first substrate, the coating is applied to the first substrate and the at least one layer is subsequently applied to the coating, wherein—following the structuring of the at least one layer and the coating, as well as the molding step—the at least one layer, in particular the at least one reinforcing element, is removed and the coating remains on the first substrate, in particular on the optical windows. The application of the coating to the first substrate prior to the deformation of the first substrate makes it possible to implement a homogeneous coating with close tolerances in the thickness of the individual layers of the coating, especially on—angled optical regions such as, e.g., angled optical windows. When the coating is applied after the deformation of the first substrate, the deposition and possible structuring of the individual layers must take place on , e.g., angled regions or surfaces, which can result in differences in the thicknesses of the individual layers, and thus location-dependent differences in the properties or optical functionality of the coating, and thus of the optical component, especially when anisotropic deposition methods are used. A broad-band antireflection coating fabricated in accordance with this embodiment could be based on a layer sequence of silicon oxide and silicon nitride, for example. In this case, the silicon oxide layer is first applied to the at least one layer, for example a silicon wafer. Then the silicon nitride layer is applied to the silicon oxide layer. Thereafter, the layer sequence consisting of at least one layer, silicon oxide layer, and silicon nitride layer is joined to the first substrate by joining the silicon nitride layer to the first substrate. After selective removal of the at least one layer, there remains a layer sequence of first substrate, silicon nitride layer, and silicon oxide layer, and hence a first substrate provided with an antireflection coating.

Combinations of coatings and functional surface structures, for example a combination of an antistatic coating and moth-eye structures, can also provide improvements in the functionality of the optical component.

The inventive cover is preferably used for encapsulating microsystems at the wafer level, in particular by means of wafer-level packaging methods. In this way multiple microsystems can be encapsulated at one time, supporting a time-saving and effective encapsulation process.

Preferably, the inventive cover is used to encapsulate micromirrors, in particular movable micromirrors.

EXAMPLES

Without loss of generality, the invention is described below with reference to examples.

FIGS. 1a and 1b show covers for a microsystem.

FIGS. 2a-2e show inventive covers 22 with angled optical windows 8 and displaced optical windows 30, and their use for encapsulating a micromirror 25.

FIGS. 3a-3g show the sequence of steps of a first process variant for fabricating an inventive cover 22 with angled optical windows 8 according to the inventive method.

FIGS. 4a-4d show the sequence of steps of a second process variant for fabricating an inventive cover 22 with angled optical windows 8 according to the inventive method using support structures 13.

FIGS. 7a-7e show the sequence of steps of the second process variant for fabricating an inventive cover 22 with two angled optical windows 8 in a deflection region 21 according to the inventive method.

FIGS. 8a-8d show the sequence of steps of the second process variant for fabricating an inventive cover 22 with two angled optical windows 8 and a displaced optical window 30 in a deflection region 21 according to the inventive method.

Figure 9A:
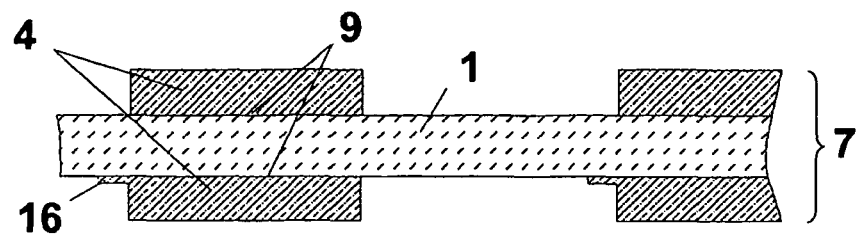
Figure 9B:
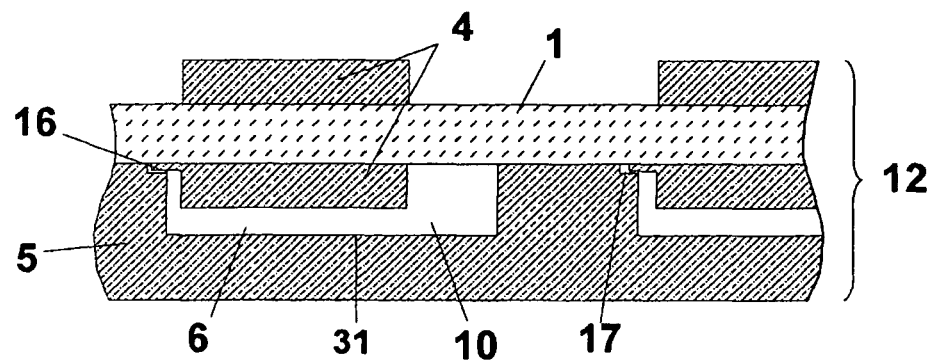
Figure 9C:
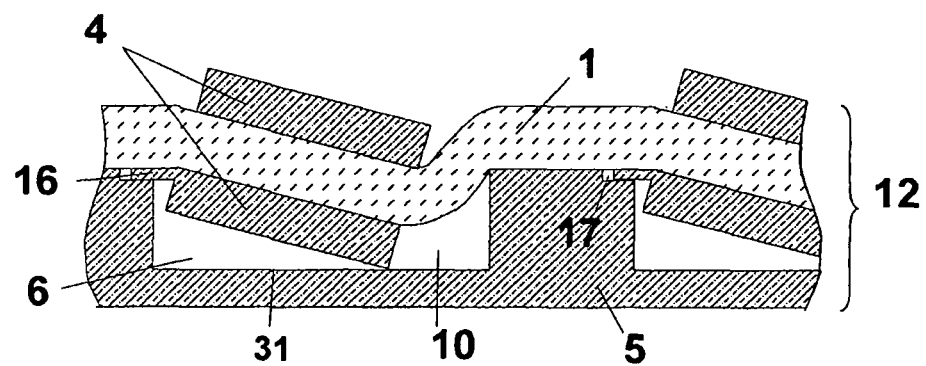

FIGS. 9a-9c show the use of fixing elements 16.

Figure 10A:
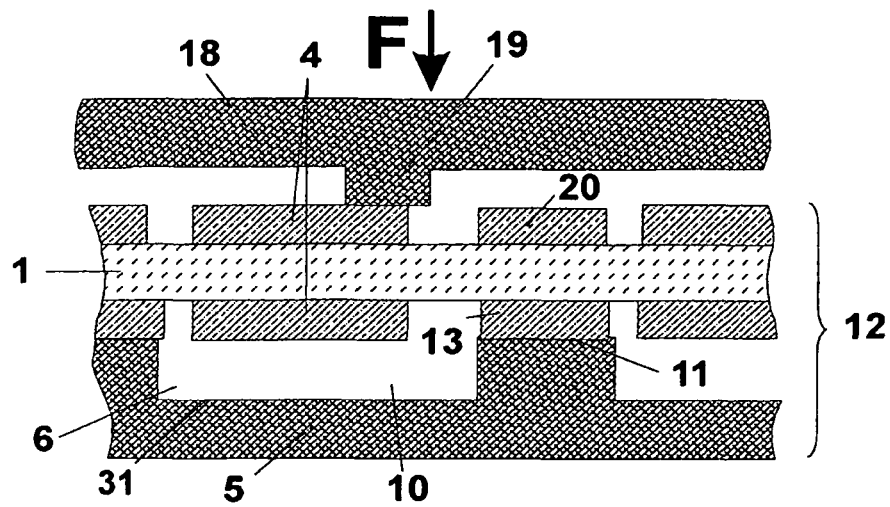
Figure 10B:
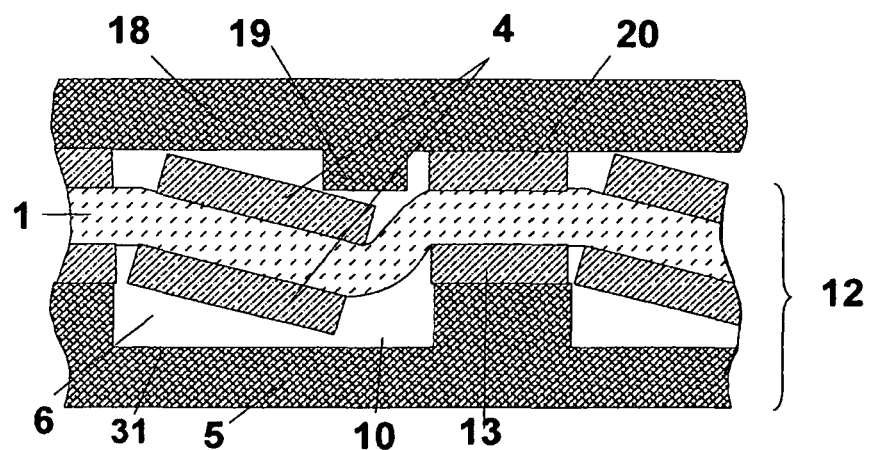
Figure 10C:
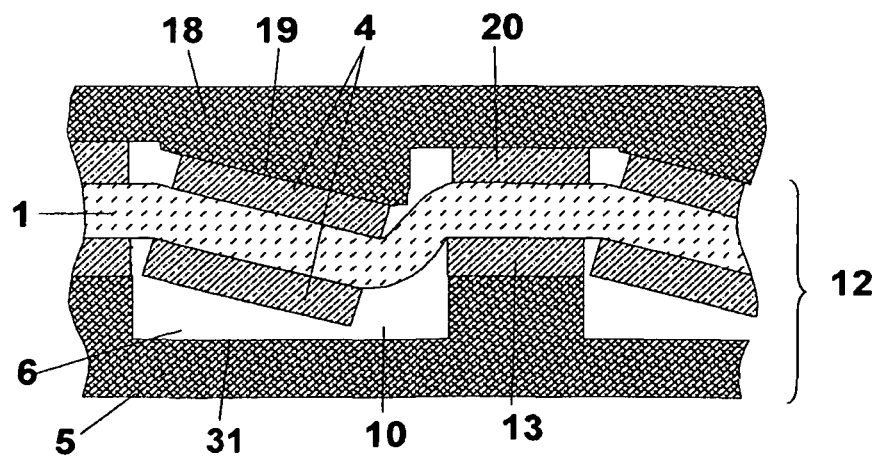

FIGS. 10a-10c show the application of a force resulting from mechanical interaction by means of molding devices.

Figure 1A:
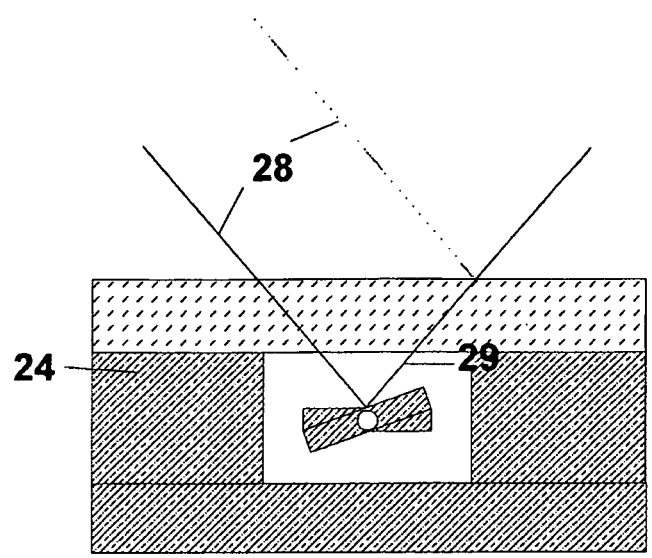
Figure 1B:
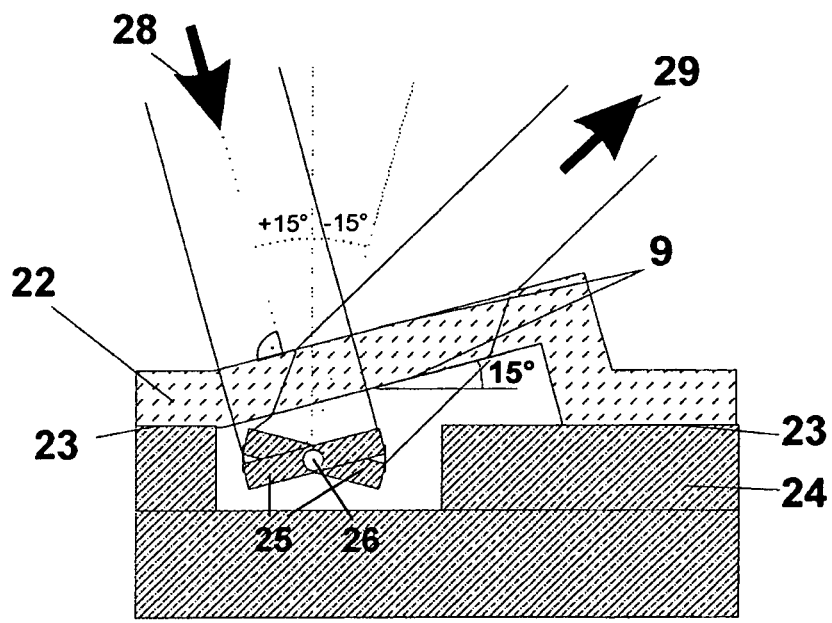
Figure 2A:
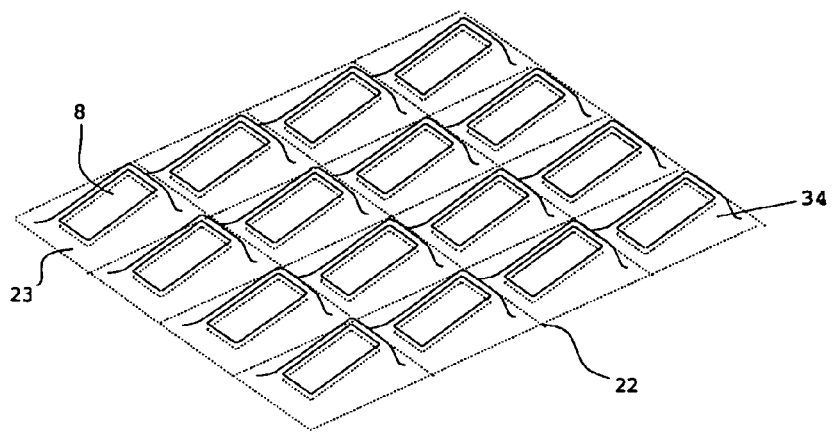

FIG. 2a shows an inventive cover 22, or the section of a glass wafer structured or molded according to the inventive method that can be used to encapsulate an entire silicon wafer. The starting point is a glass wafer 1 made of borosilicate glass with flat, plane parallel substrate planes 1a, 1b on both sides. Both wafer sides or wafer planes 1a, 1b are polished in order to ensure low surface roughness and thus high quality of the angled optical windows 8. The angled optical windows 8 are arranged in a two-dimensional array and typically have an inclination between approximately 5° and approximately 20°, preferably approximately 15°, with respect to the surrounding contact areas 23. The surrounding contact areas 23 are arranged in the shape of a closed frame around each angled optical window 8, and are flat in design. Closed frame-shaped flat areas of corresponding dimensions are provided on the carrier substrate or carrier wafer 24 as mating contact surfaces, thus permitting a connection that is hermetically sealed from the environment. The angled optical windows 8 are provided on both sides with an antireflection coating consisting of a layer system of silicon dioxide and titanium oxide.

Figure 2B:
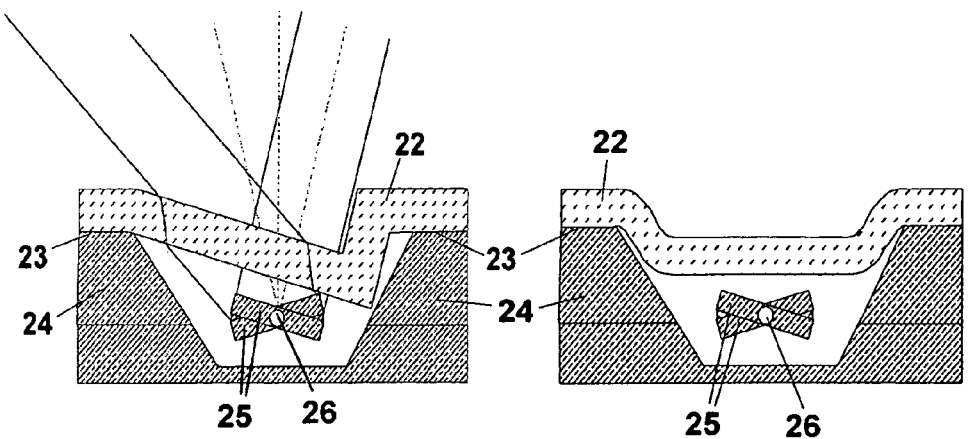
Figure 2C:
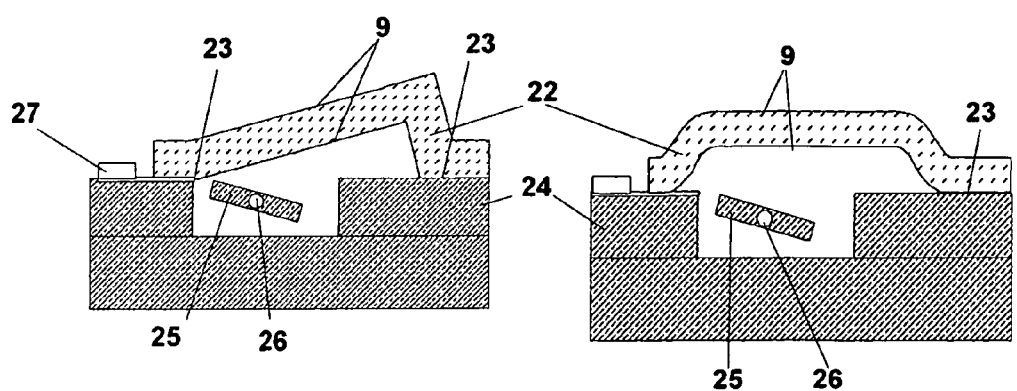
Figure 2D:
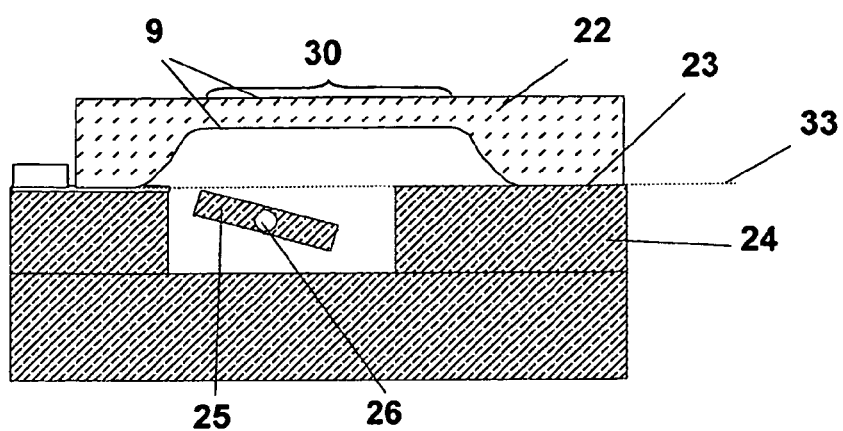
Figure 2E:
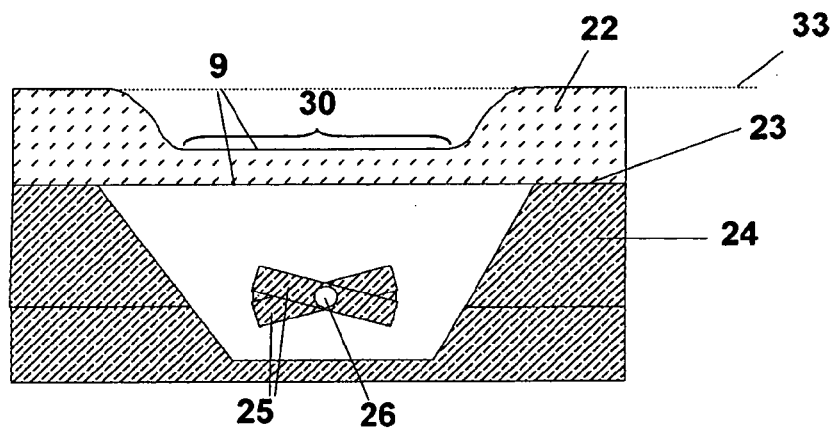

FIGS. 2b and 2c each show two variant applications of the inventive cover 22 with angled optical windows (8) and displaced optical windows (30) for encapsulating a micromirror 25.

FIG. 3 shows the sequence of steps of a first process variant for fabricating an inventive cover 22 according to the inventive method. The first substrate 1 provided at the beginning of the process is a glass wafer made of borosilicate glass with flat, plane parallel substrate planes 1a, 1b on both sides. Both wafer sides or wafer planes 1a, 1b of the glass wafer 1 are polished, and thus have high surface quality with low roughness.

In addition, two silicon wafers 2 are provided, which have second recesses 3 (see FIG. 3a) on each wafer side that is to be joined to the glass wafer 1. During the joining of the glass wafer 1 and silicon wafers 2, the second recesses 3 are intended to avoid contact between the glass wafer 1 and silicon wafers 2 in the regions of the glass wafer 1 where no reinforcing elements 4 are provided, in order to protect these regions of the glass wafer 1 for further joining and/or contacting steps, for example anodic bonding of the glass wafer 1 to the at least one second substrate 5. The second recesses 3 have depths of approximately 0.7 µm.

Figure 3A:
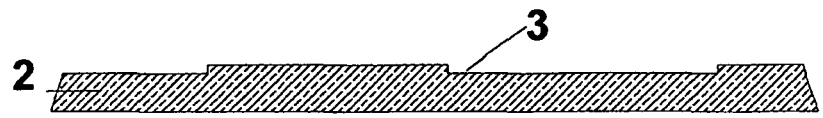
Figure 3B:
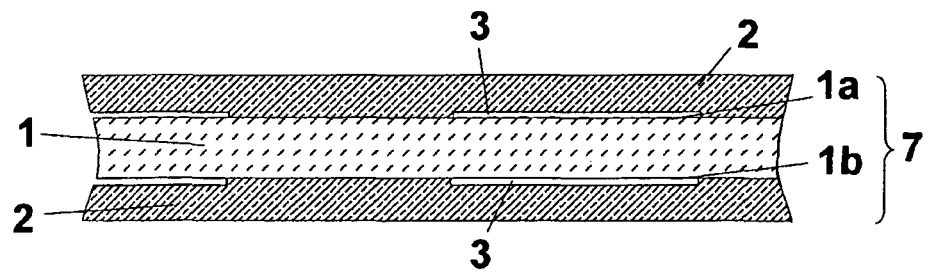
Figure 3C:
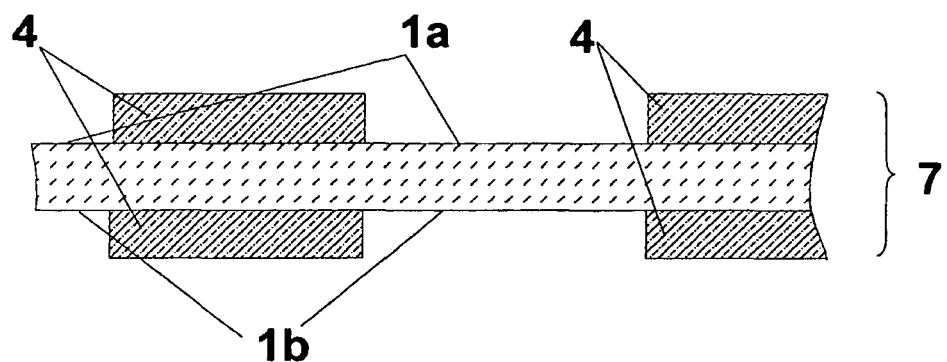

Using anodic bonding, one silicon wafer 2 is joined to each substrate side 1a, 1b of the glass wafer 1 to form a stack 7, as shown in FIG. 3b. In the subsequent structuring process, the two silicon wafers 2 of the stack 7 are structured by wet chemical etching processes and/or dry etching processes such that silicon remains as reinforcing elements 4 (FIG. 3c) in the regions of the glass wafer 1 that function as angled optical windows 8. As a result, the individual reinforcing elements 4 are completely surrounded and separated from one another by regions of the glass wafer 1 that have been freed of silicon.

Figure 3D:
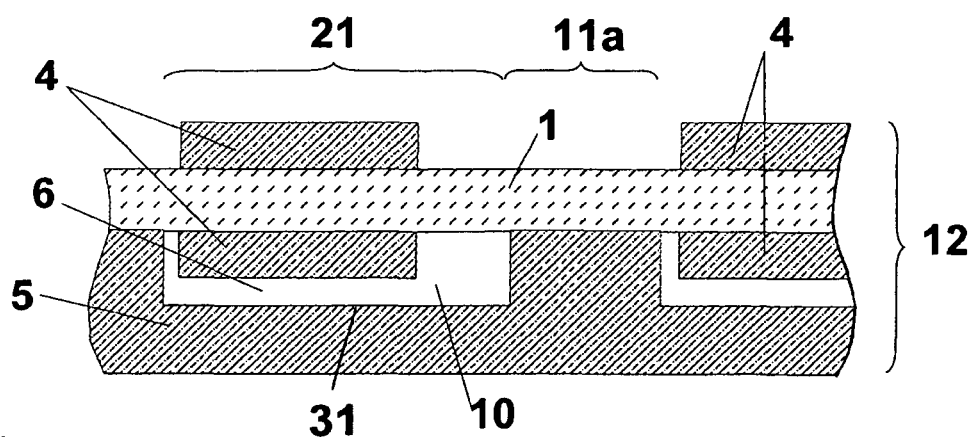

In the next process step, an additional silicon wafer with third recesses 6 is provided as the at least one second substrate 5, and is joined to the structured stack 7, in particular with the glass wafer 1, by anodic bonding to form a layer system 12. In this process, the stack 7 and the silicon wafer 5 are arranged with respect to one another such that the third recesses 6 in the silicon wafer 5, after joining with the stack 7, form cavities 10 between the silicon wafer 5 and the stack 7 that are hermetically sealed from the environment and enclose the reinforcing elements 4 that face the silicon wafer 5. Moreover, the reinforcing elements 4 are located off-center in the deflection region 21, and thus between the support surfaces 11 or support areas 11a. As is shown by FIG. 3d, there is no contact between the reinforcing elements 4 and the silicon wafer 5 prior to heating and deformation.

The anodic bonding takes place at temperatures of approximately 400° C. and a pressure of approximately 600 mbar or approximately 800 mbar.

Figure 3E:
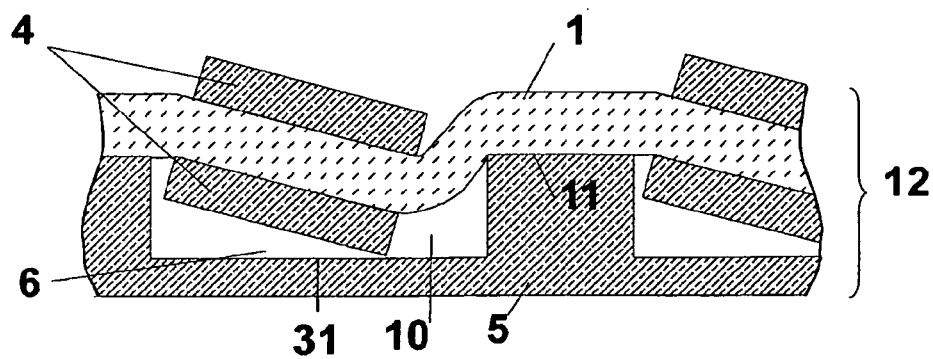
Figure 3F:
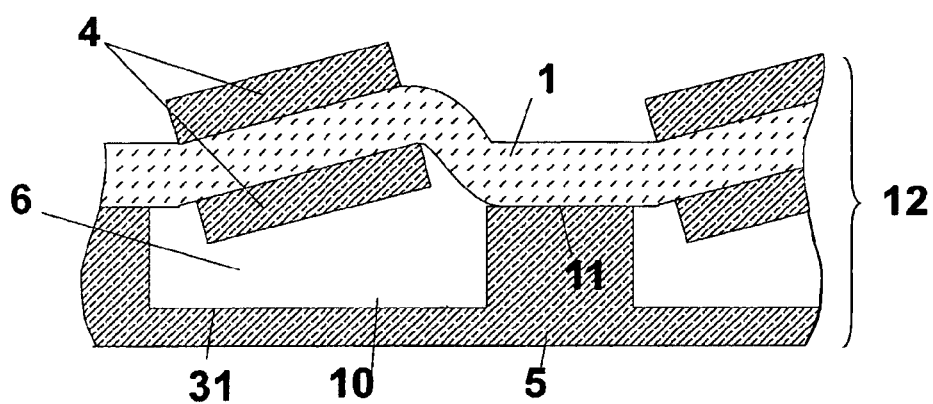

During the subsequent process step, the layer system 12 consisting of the silicon wafer 5 and the stack 7 are first heated. When a glass wafer 1 made of borosilicate glass, with a softening temperature of approximately 820° C., is used, the layer system 12 consisting of the silicon wafer 5 and the stack 7 is heated to approximately 800° C. Due to the temperature, which is elevated as compared to the bonding process, the pressure in the cavities 10 rises from approximately 600 mbar to approximately 900 mbar, or from approximately 800 mbar to approximately 1200 mbar. The underpressure or overpressure with respect to the ambient atmospheric pressure that prevails accordingly results in a force acting on the glass substrate 1 to draw it into or press it out of the third recesses 6 of the silicon wafer 5, by which means the regions of the glass wafer 1 that are covered by the reinforcing elements 4 become angled, as is shown in FIGS. 3e and 3f. The deformation step is terminated when the reinforcing elements 4 contact the floor 31 of the third recesses 6 or after the pressure in the cavities 10 has reached the level of the ambient pressure as a result of the deformation.

Figure 3G:
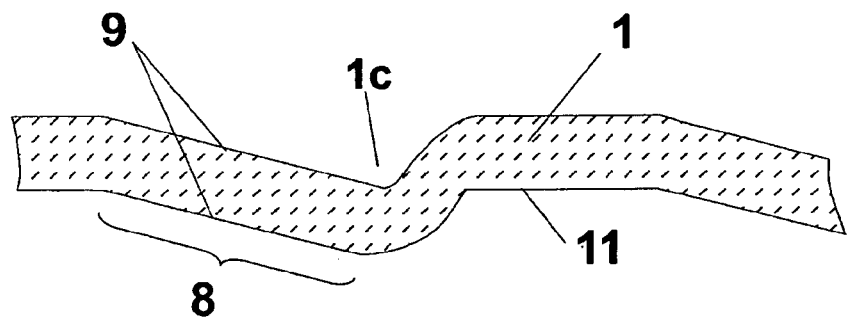

In the last step, the reinforcing elements 4 and the silicon wafer 5 are selectively removed from the glass wafer 1 by wet chemical means (FIG. 3g).

FIG. 4 shows a second process variant for fabricating a cover 22 according to the inventive method. After provision of a glass wafer 1 made of borosilicate glass and two silicon wafers 2, as in the process variant discussed above, one silicon wafer 2 is joined by anodic bonding to each of the substrate sides 1a, 1b of the glass wafer 1 to form a stack 7.

In the subsequent structuring process, the two silicon wafers 2 of the stack 7 are structured by wet chemical etching processes and/or dry etching processes such that silicon remains as reinforcing elements 4 and as support structures 13 (FIG. 4a) in the regions of the glass wafer 1 that function as angled optical windows 8, and in the regions of the glass wafer 1 that function as support surfaces 11 or support regions 11a. The support structures 13 form a closed frame around a reinforcing element 4 located on the same substrate side 1b of the glass wafer 1, and serve to protect the support surfaces 11 of the glass wafer 1 during contact of the stack 7 with the at least one second substrate 5. As a result of this protection, direct contact between glass wafer 1 and at least one second substrate 5 is avoided, by which means the good flatness and low roughness of the support surfaces 11 can be preserved regardless of the surface quality of the at least one second substrate 5. Once again, the reinforcing elements 4 are located off-center between the support surfaces 11 or support structures 13.

As the at least one second substrate 5, a substrate or tool is used that has third recesses 6 and, moreover, is made of graphite or at least its mating contact surfaces 14, which are provided for contact with the stack 7, are coated with graphite. This at least one second substrate 5 having graphite also has channels 15, which ensure connection to an external vacuum pump.

Figure 4A:
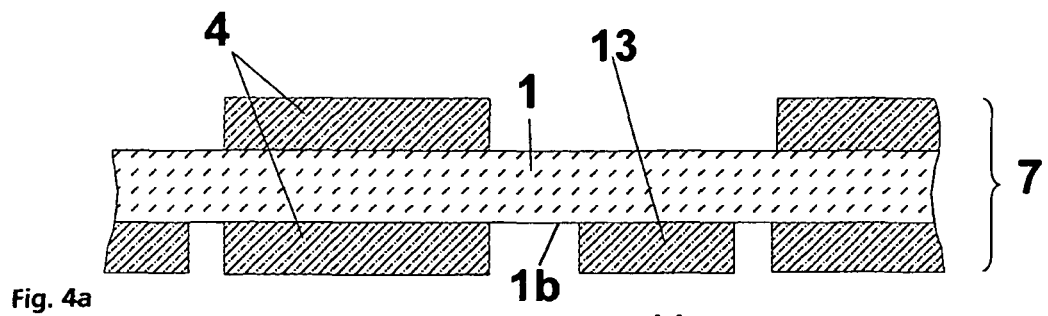
Figure 4B:
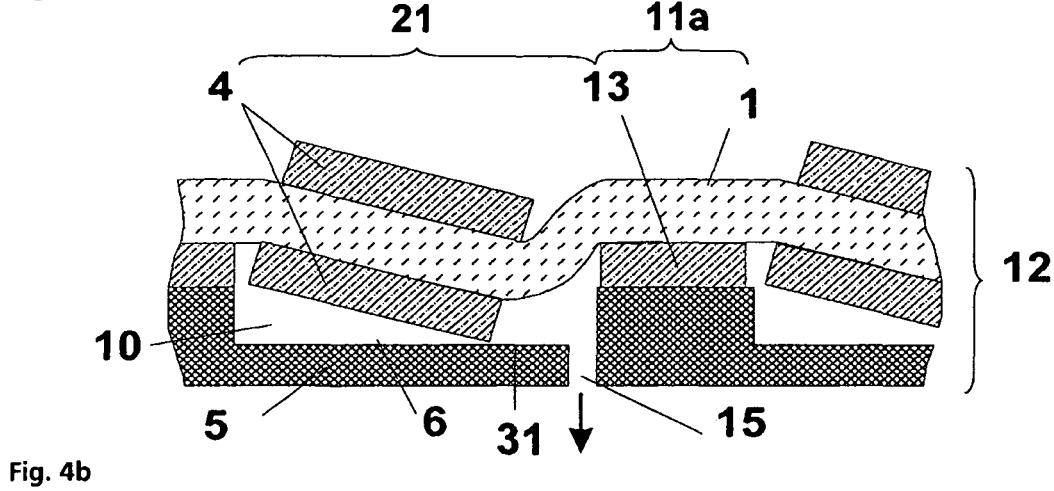

In the next method step, the support structures 13 of the stack 7 and the at least one second substrate 5 having graphite are brought into contact with one another in such a manner that the third recesses 6 in the second substrate 5, after having been brought into contact with the stack 7, form cavities 10 between the second substrate 5 and the stack 7 that are sealed from the environment, wherein the cavities 10 enclose the reinforcing elements 4 that face the second substrate 5 and do not have to be hermetically sealed from the environment. An underpressure is produced in the cavities 10 through the channels 15 by means of the external vacuum pump (FIG. 4b).

The subsequent heating and deformation step is carried out as described for the preceding process variant.

Figure 4C:
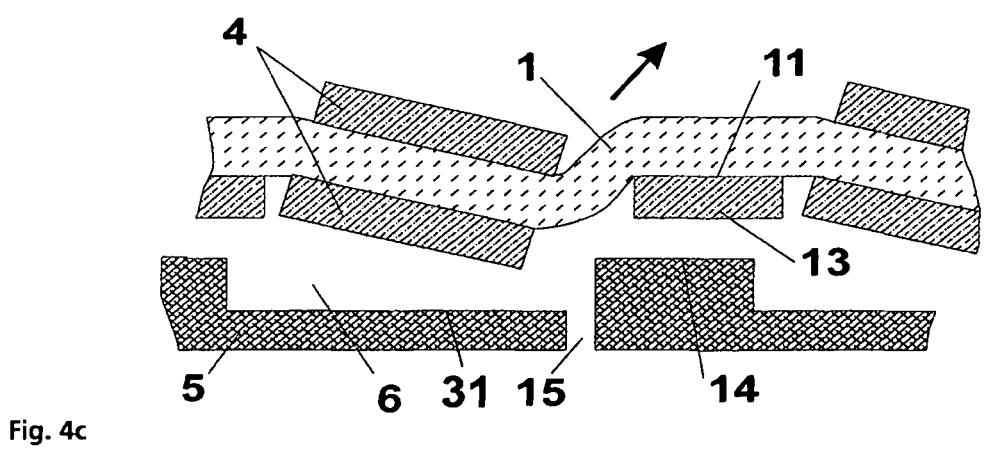

After this, atmospheric pressure (ambient pressure) is again established in the cavities 10. In this way, the stack 7 can be lifted away from, or separated from, the second substrate 5, as FIG. 4c shows.

Figure 4D:
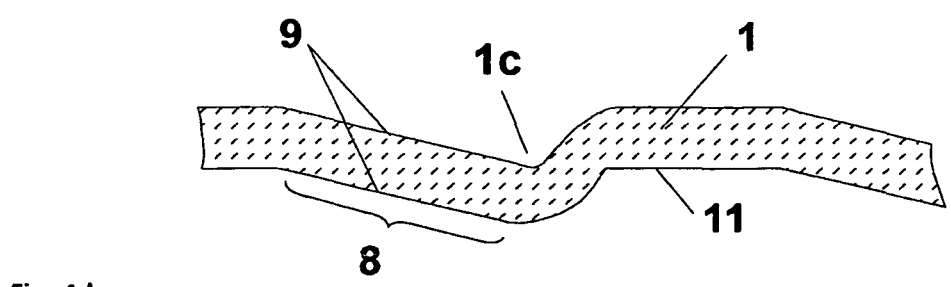
Figure 5A:
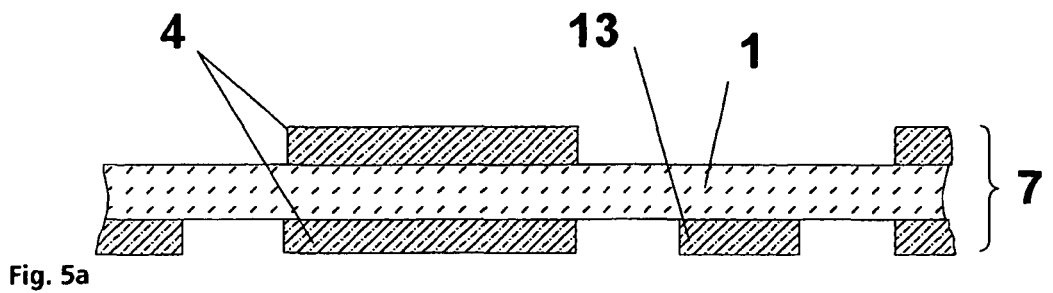
FIGS. 5a-5e show the sequence of steps of the second process variant for fabricating an inventive cover 22 with displaced optical windows 30 according to the inventive method.
Figure 5B:
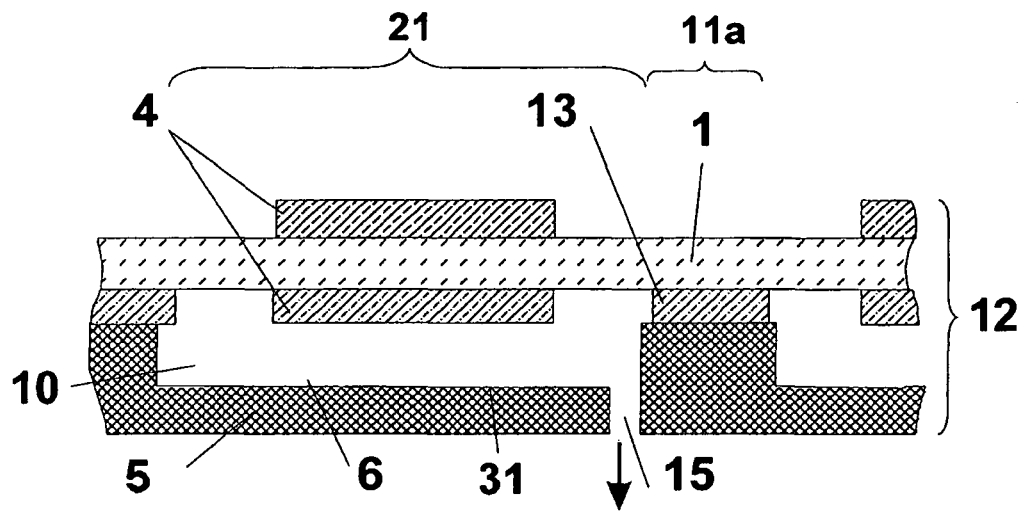
Figure 5C:
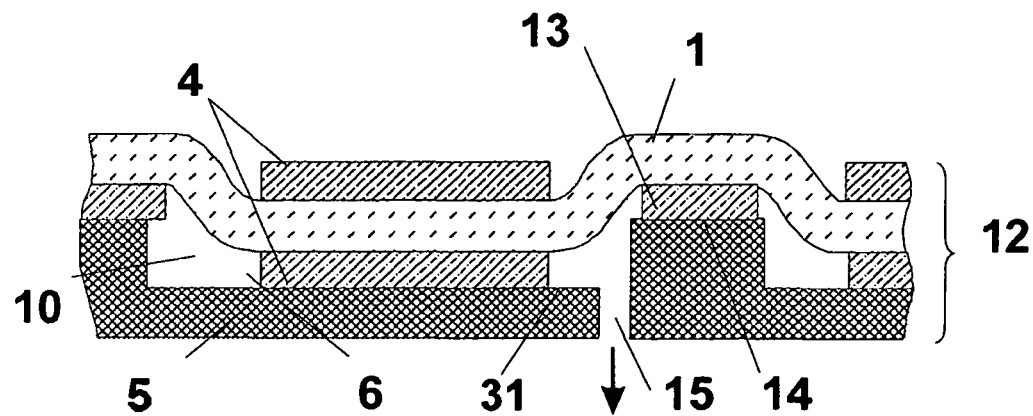
Figure 5D:
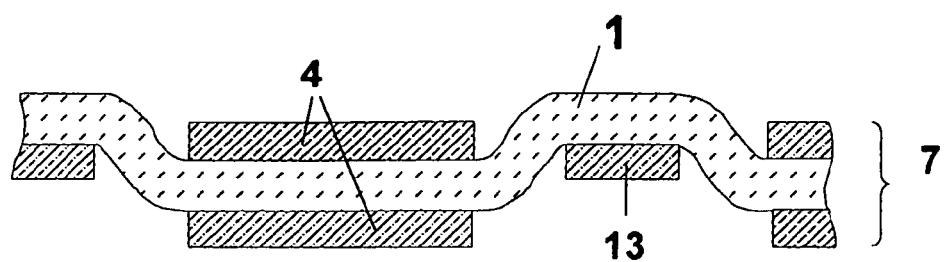
Figure 5E:
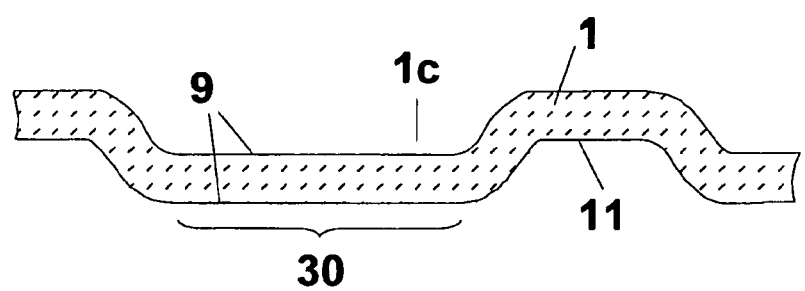
Figure 6A:
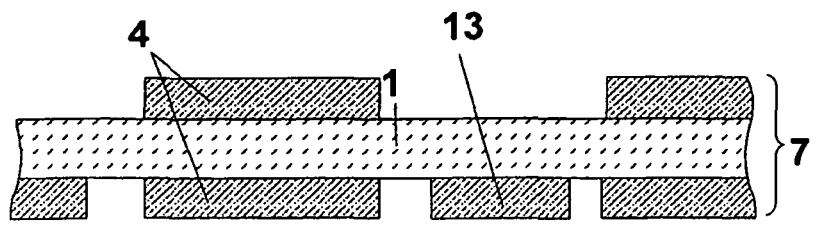
FIGS. 6a-6e show the sequence of steps of the second process variant for fabricating an inventive cover 22 with displaced and angled optical windows 32 according to the inventive method.
Figure 6B:
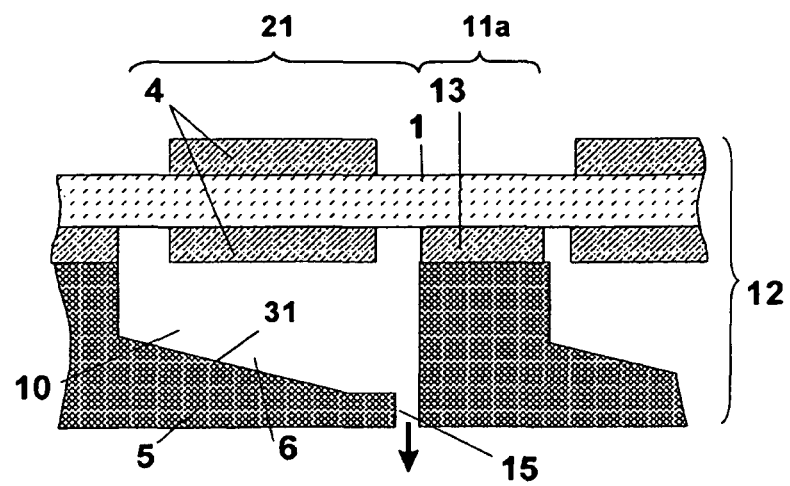
Figure 6C:
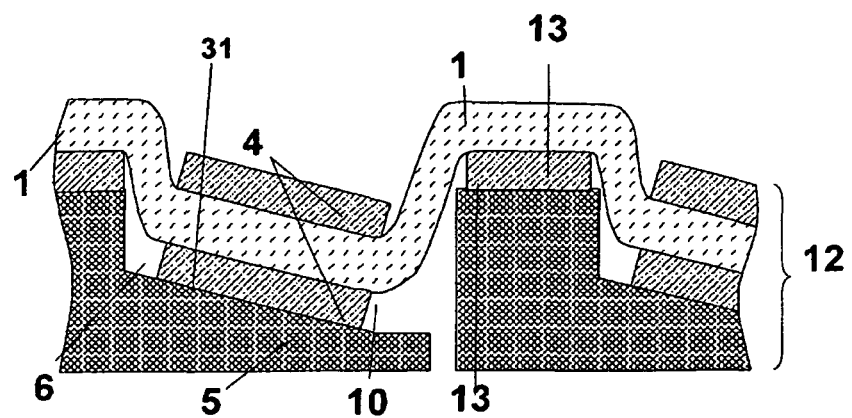
Figure 6D:
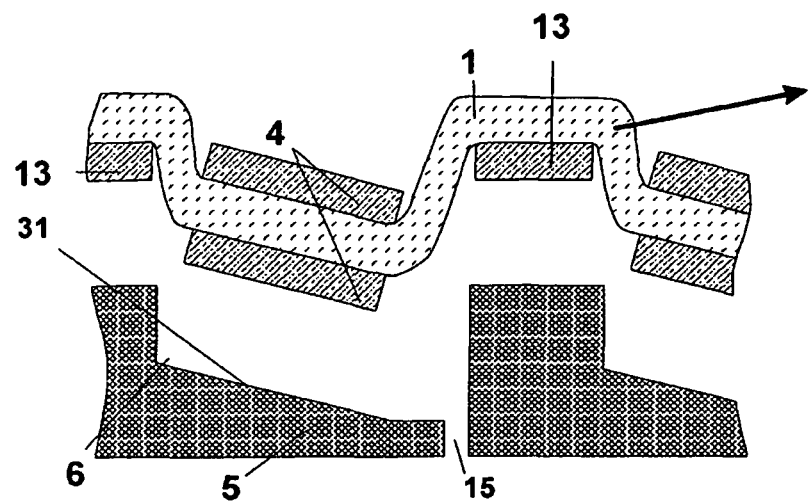
Figure 6E:
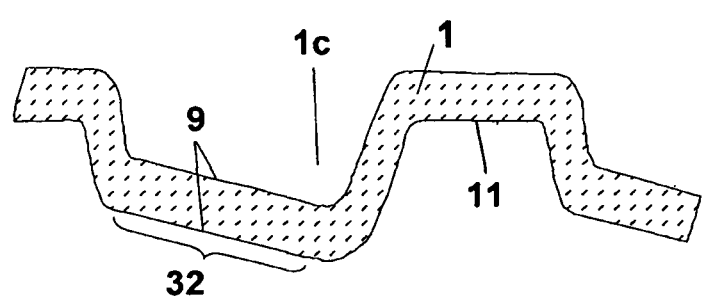

In the final process step, the reinforcing elements 4 and the support structures 13 are removed from the glass wafer 1 by selective wet chemical etching (FIG. 4d).

FIG. 5a-5d show how an inventive cover 22 with displaced optical windows 30 can be fabricated using the inventive method in accordance with the previously described second process variant.

As described above, a substrate or tool that has third recesses 6 is used for the at least one second substrate 5. A displacement or parallel displacement out of the substrate planes 1a, 1b of the regions of the first substrate 1 covered by the reinforcing elements 4 is supported by a centered arrangement of the reinforcing elements 4 in the deflection regions 21. The deformation step can continue to occur until the reinforcing elements 4 contact the floor 31 of the third recesses 6 of the at least one second substrate 5.

An inventive cover 22 with optical windows 32 that are displaced and inclined can be fabricated by means of a design of the floors 31 of the third recesses 6 that is inclined at least in sections, and/or an off-center arrangement of the reinforcing elements 4 in the deflection regions 21, as is shown in FIG. 6a-6d.

Further modifications of the second process variant for fabricating an inventive cover 22 using the inventive method are shown in FIGS. 7 and 8.

Figure 7A:
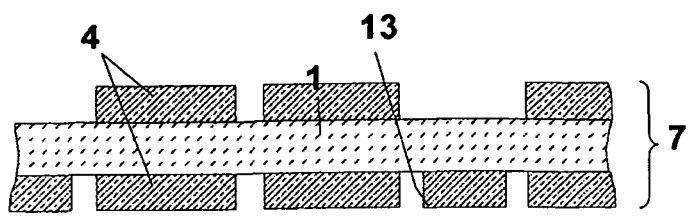
Figure 7B:
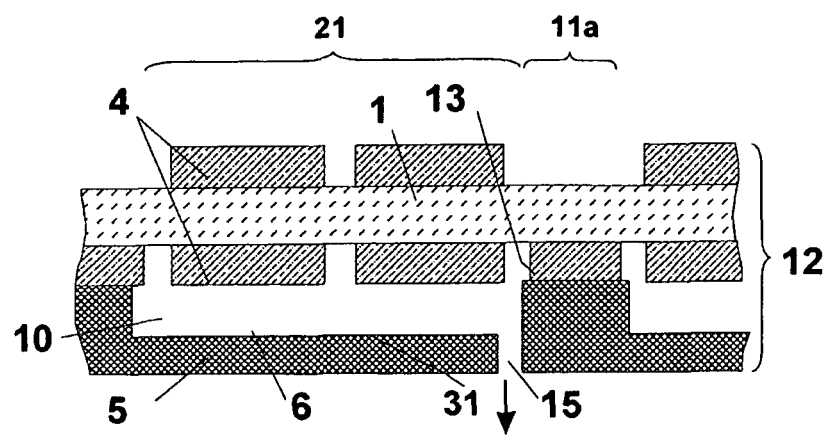
Figure 7C:
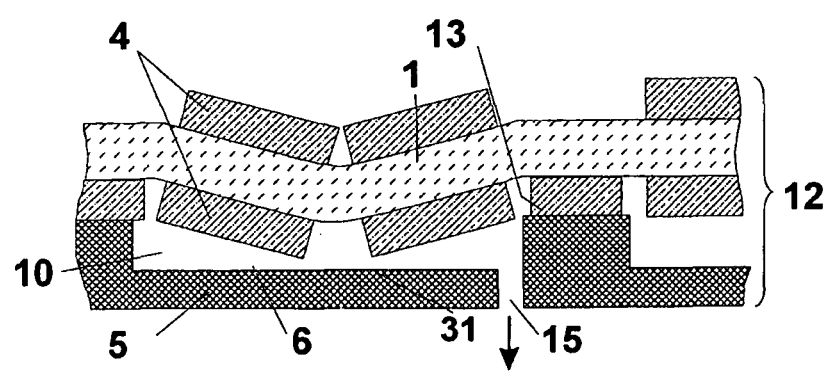
Figure 7D:
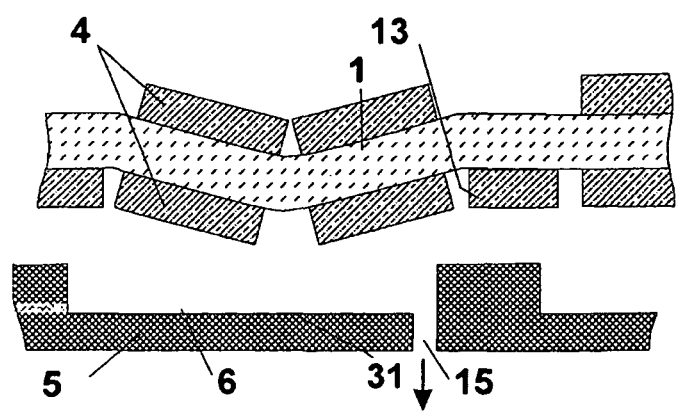
Figure 7E:
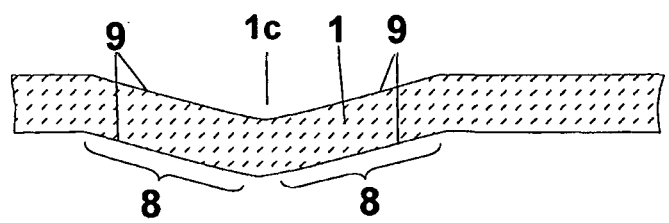
Figure 8A:
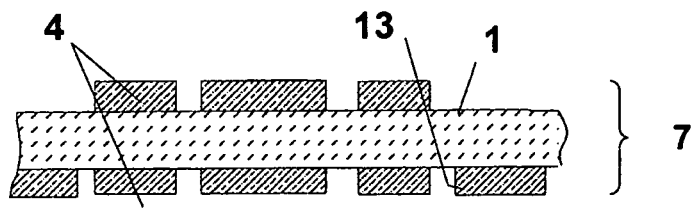
Figure 8B:
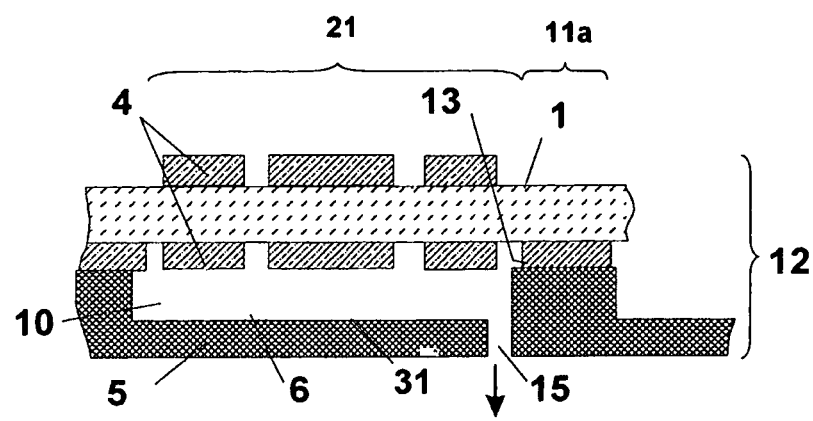
Figure 8C:
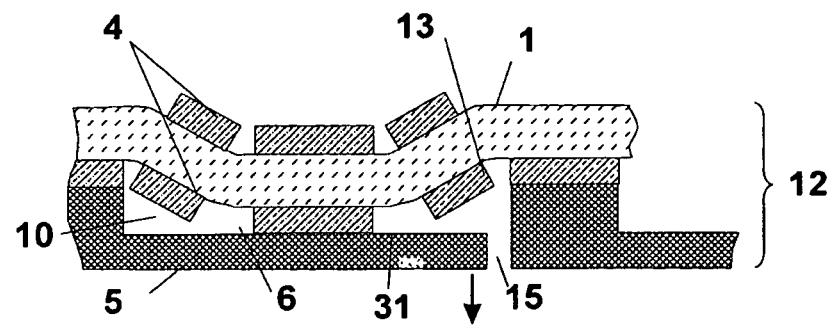
Figure 8D:
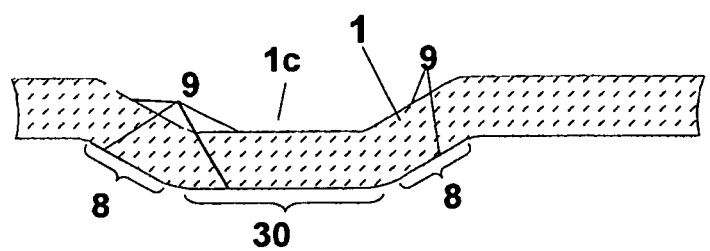

By appropriate structuring of the two silicon wafers 2 (FIG. 7a, FIG. 8a), a lateral arrangement of multiple reinforcing elements 4 can be implemented in one deflection region 21 (FIG. 7b, FIG. 8b). In the subsequent heating and deformation step, this results in multiple displaced and/or inclined regions or optical windows 8, 30 of the glass wafer 1 in one deflection region 21 (FIG. 7c, FIG. 8c). Finally, the reinforcing elements 4 and support structures 13 are removed from the glass wafer 1 by selective wet chemical etching (FIG. 7d, FIG. 8d).

FIG. 9 shows the use of fixing elements 16 in the fabrication of an inventive cover 22 using the inventive method. As is evident from FIG. 9a, the fixing elements 16 can be produced during the structuring of the silicon wafers 2 attached to the first substrate or the glass wafer 1 and intended for producing the reinforcing elements 4. During the subsequent anodic bonding of stack 7 and the at least one second substrate 5, here a silicon wafer, the fixing elements 16 are clamped between the surfaces to be joined and are fixed in place thereby. In order to be able to ensure a stable bond despite the fixing elements 16, the at least one second substrate 5 is designed with receiving grooves 17 for the fixing elements 16 (FIG. 9b).

In the subsequent heating and deformation step, the clamped fixing elements 16 prevent a displacement and/or twisting of the reinforcing elements 4. Moreover, the fixing elements 16 reduce inadvertent deformations, for example bulges, in the regions of the glass wafer 1 covered by the fixing elements 16 (FIG. 9c).

In the aforementioned process variants, the deformation of the glass wafer 1 is supported by a force that results from a pressure difference between ambient pressure and the pressure prevailing in the cavities 10 enclosed by the stack 7 and the at least one second substrate 5.

In another process variant, this force is introduced by a molding device 18 with a die element 19. Here, the die element 19 is oriented such that the force acts off-center with respect to the reinforcing elements 4 (FIG. 10a). In this way, an angling of the reinforcing elements 4 and the regions of the glass wafer 1 covered by them is fostered. The force is maintained until the desired inclination of the regions of the glass wafer 1 covered by the reinforcing elements 4 is achieved.

In order to increase the precision of the inclination of the angled optical windows 8, special stop structures 20, which limit the maximum deflection of the die element 19, are placed or arranged on the glass wafer 1. These stop structures 20 can be applied to the glass wafer 1 in the form of layers or layer sequences. The maximum deflection of the die element 19, and hence the desired inclination, can be adjusted by varying the thickness of the layers or layer sequences, since the molding process is terminated as soon as the molding device 18 comes into contact with a stop structure 20, as is shown in FIG. 10b.

The stop structures 20 can be produced in the same process step as the reinforcing elements 4 by structuring the at least one layer 2, for example, and/or they can be produced in one or more additional steps.

A further increase in the precision of the molding process can be achieved through a die element 19 which has an angled die face (FIG. 10c) that has the inclination desired for the optical windows 8.

The molding device 18 can be designed such that it can be used repeatedly, for example in that direct contact of the molding device 18 with the glass wafer 1 is avoided.

LIST OF REFERENCE NUMBERS 1 first substrate, e.g. glass wafer
1a first substrate plane or substrate side of the first substrate
1b second substrate plane or substrate side of the first substrate
1c first recess in the first substrate
2 at least one layer, e.g. silicon wafer
3 second recess in the at least one layer
4 reinforcing element
5 at least one second substrate, e.g. silicon wafer
6 third recess in the at least one second substrate
7 stack
8 angled optical window
9 transmission surface of the optical window
10 cavity between stack and at least one second substrate
11 support surfaces
11a support regions
12 layer system of stack and at least one second substrate
13 support structure
14 mating contact surface of the at least one second substrate
15 channel in the at least one second substrate 16 fixing element
17 receiving groove in the at least one second substrate
18 molding device
19 die element, e.g. with straight or angled die face
20 stop structure
21 deflection region
22 cover
23 contact area of the cover
24 carrier substrate
25 micromirror
26 suspension of the micromirror
27 contact pad
28 incident radiation
29 deflected radiation
30 displaced optical window
31 floor of the third recess in the at least one second substrate
32 displaced and angled optical window
33 base plane of the cover
34 cover unit

What is claimed is:

1. Cover for microsystems that is made in one piece from a substrate, said cover defining at least two substrate planes on different sides of the cover (33=1a, 1b), said cover comprises one or more cover units (34), wherein at least one cover unit (34) has at least one first recess (1c), wherein the first recess (1c) is at least partly bounded by at least one optical window (8, 30, 32) which comprises at least two transmission surfaces (9) whose root mean square surface roughness is less than or equal to 25 nm and each of the at least two transmission surfaces is arranged to be inclined and/or displaced relative to the substrate plane on the side of the cover where the corresponding transmission surface is arranged.

2. Cover according to claim 1, characterized in that the root mean square surface roughness of the at least one optical window (8, 30, 32) is less than or equal to 15 nm, preferably less than or equal to 5 nm.

3. Cover according to claim 1, characterized in that the cover (22) contains or is made of glass and/or a glass-like material, at least in sections.

4. Cover according to claim 3, characterized in that the glass is a silicate glass, in particular borosilicate glass.

5. Cover according to claim 1, characterized in that the maximum dimension of the cover (22) is greater than or equal to 80 mm, in particular greater than or equal to 150 mm.

6. Cover according to claim 1, characterized in that the transmission surfaces (9) of the at least one optical window (8, 30, 32) are designed to be flat and/or plane parallel to one another.

7. Cover according to claim 6, characterized in that the transmission surfaces (9) have a flatness and/or plane parallelism deviation less than one fourth the wavelength of the electromagnetic radiation used in the application.

8. Cover according to claim 6, characterized in that the transmission surfaces (9) have a flatness and/or plane parallelism deviation of less than or equal to 180 nm, preferably less than or equal to 110 nm.

9. Cover according to claim 1, characterized in that the cover (22) is provided at least in part with at least one coating and/or functional surface structures.

10. Cover according to claim 9, characterized in that the at least one coating is an antireflection coating, an absorption coating, and/or a reflective coating.

11. Cover according to claim 9, characterized in that the at least one coating is an antistatic coating.

12. Cover according to claim 11, characterized in that the antistatic coating contains or is made of ITO.

13. Cover according to claim 9, characterized in that the functional surface structures are moth-eye structures.

14. Cover according to claim 1 for encapsulating at least one micromirror (25) that is pivotably mounted with respect to the plane of the carrier substrate, characterized in that at least one of the optical windows (8, 30, 32) is designed to be angled with respect to the plane of the carrier substrate once the cover (22) has been joined to the carrier substrate (24).

15. Cover according to claim 14, characterized in that the angle of inclination of the optical window (8, 30, 32) is greater than the maximum pivot angle of the operating range of the pivotably mounted micromirror (25).

16. Cover according to claim 15, characterized in that the angle of inclination is greater than or equal to 15°.

17. Use of the cover (22) according to claim 1 for encapsulating micromirrors (25), in particular movable micromirrors (25).

18. Use of the cover (22) according to claim 1 or encapsulating at the wafer level.

19. Method for fabricating optical components having the following steps:
    providing a first substrate (1),
    producing a stack (7) by applying at least one layer (2) to the first substrate (1),
    structuring the at least one layer (2) to produce at least one reinforcing element (4),
    providing at least one second substrate (5),
    bringing the at least one second substrate (5) into contact with the stack (7),
    heating and deforming the first substrate (1) in such a manner that at least one region of the first substrate (1) covered by the at least one reinforcing element (4) is displaced and/or inclines.

20. Method according to claim 19, characterized in that the first substrate (1) contains or is made of glass and/or a glass-like material, at least in sections.

21. Method according to claim 20, characterized in that the glass is a silicate glass, in particular borosilicate glass.

22. Method according to claim 19, characterized in that the at least one layer (2) contains or is made of a semiconducting material, at least in sections.

23. Method according to claim 22, characterized in that the at least one layer (2) is a semiconductor wafer, in particular a silicon wafer.

24. Method according to claim 19, characterized in that the at least one layer (2) has at least one second recess (3), at least on the side of the layer that is joined to the first substrate (1).

25. Method according to claim 19, characterized in that the application of the at least one layer (2) to the first substrate (1) is carried out by anodic bonding and/or thermal bonding.

26. Method according to claim 19, characterized in that at least one fixing element (16) is produced which reduces or prevents a displacement and/or twisting of the at least one reinforcing element (4) with respect to the first substrate (1) after the stack (7) has been brought into contact with the at least one second substrate (5).

27. Method according to claim 26, characterized in that the at least one fixing element (16) is created in the same process step as the at least one reinforcing element (4) through the structuring of the at least one layer (2).

28. Method according to claim 19, characterized in that one or more support structures (13) are created, wherein the creation of the support structures (13) takes place such that the support structures (13) protect the support regions (11a) of the first substrate (1), and/or function as spacers between the first substrate (1) and the at least one second substrate (5).

29. Method according to claim 28, characterized in that the at least one support structure (13) is created in the same process step as the at least one reinforcing element (4) through the structuring of the at least one layer (2).

30. Method according to claim 28, characterized in that the stack (7) is brought into contact with the at least one second substrate (5) in such a way that cavities (10) are formed between the at least one second substrate (5) and the stack (7) by the support structures (13).

31. Method according to claim 19, characterized in that at least one of the reinforcing elements (4) is arranged on each of the two substrate sides (1a, 1b) of the first substrate (1).

32. Method according to claim 19, characterized in that at least one of the reinforcing elements (4) is arranged such that an inclination of the region(s) of the first substrate (1) covered by this/these reinforcing element(s) (4) is assisted during heating and deformation.

33. Method according to claim 32, characterized in that at least one of the reinforcing elements (4) is located off-center in the deflection region (21) of the first substrate (1).

34. Method according to claim 19, characterized in that the regions of the at least one second substrate (5) that are brought into contact with the stack (7) contain or are made of graphite.

35. Method according to claim 19, characterized in that the at least one second substrate (5) has at least one third recess (6).

36. Method according to claim 35, characterized in that the at least one third recess (6) is between 100 µm and 1000 µm deep.

37. Method according to claim 35, characterized in that the stack (7) is brought into contact with the at least one second substrate (5) in such a way that cavities (10) are formed between the at least one second substrate (5) and the stack (7) by the third recesses (6) in the at least one second substrate (5).

38. Method according to claim 37, characterized in that a pressure that is above or below the ambient pressure, in particular atmospheric pressure, is created in the cavities (10).

39. Method according to claim 19, characterized in that, during the method step of heating and deformation, the first substrate (1) is brought to a temperature that is between 150° C. below the softening temperature and 100° C. above the softening temperature of the material of the deformation regions, in particular between approximately 750° C. and approximately 900° C.

40. Method according to claim 19, characterized in that the deformation of the first substrate (1) is caused by the dead weight.

41. Method according to claim 19, characterized in that the deformation of the first substrate (1) is caused by an externally applied force.

42. Method according to claim 41, characterized in that the externally applied force is caused by a pressure difference between the two substrate sides (1a, 1b) of the first substrate (1), particularly in the deflection region (21).

43. Method according to claim 19, characterized in that the at least one layer (2) is at least partially removed after the deformation.

44. Method according to claim 19, characterized in that the first substrate (1) is provided, at least in sections, with at least one coating, in particular with an antireflection coating, an antistatic coating, a reflective coating and/or an absorption coating, and/or with functional surface structures.

45. Method according to claim 44, characterized in that moth-eye structures are produced as functional surface structures such that, prior to the application of the at least one layer (2) to the first substrate (1), at least the side of the at least one layer (2) that is brought into contact with the first substrate (1) is provided with a negative mold of the moth-eye structures, and after the application of the at least one layer (2) on the first substrate (1), the moth-eye structures are created on the first and/or second substrate sides (1a, 1b) of the first substrate (1) during the molding of the first substrate (1) by the means that the negative mold in the at least one layer (2) is molded onto the first and/or second substrate sides (1a, 1b) of the first substrate (1), in particular onto the transmission surfaces (9) of the optical windows (8, 30, 32).

46. Method according to claim 44, characterized in that the coating is created such that, prior to the application of the at least one layer (2) to the first substrate (1), at least the side of the at least one layer (2) that is brought into contact with the first substrate (1) is provided with the coating, and subsequently the joining between the first substrate (1) and the at least one layer (2) is produced by a joining between the coating and the first substrate (1), or in that, prior to the application of the at least one layer (2) to the first substrate (1), the coating is applied to the first substrate (1) and the at least one layer (2) is subsequently applied to the coating, wherein—following the structuring of the at least one layer (2) and the coating, as well as the molding step—the at least one layer (2), in particular the at least one reinforcing element (4), is removed and the coating remains on the first substrate (1), in particular on the optical windows (8, 30, 32).

47. Cover for microsystems that is made in one piece from a first substrate, said cover defining at least two substrate planes on different sides of the first substrate of the cover (33=1a, 1b), said cover comprises one or more cover units (34), wherein at least one cover unit (34) has at least one first recess (1c) wherein the first recess (1c) is at least partly bounded by at least one optical window (8, 30, 32) which comprises at least two transmission surfaces (9) whose root mean square surface roughness is less than or equal to 25 nm and each of the at least two transmission surfaces is arranged to be inclined and/or displaced relative to the substrate plane on the side of the cover where the corresponding transmission surface is arranged, wherein said cover unit is formed by providing at least one reinforcing element to at least one transmission surface of said first substrate of the cover, providing a second substrate, moving the first and second substrates with respect to each other and removing said reinforcing element(s) from said first substrate.

48. Cover according to claim 47 wherein the removing of said reinforcing element(s) takes place while maintaining the root mean square surface roughness of the inclined and/or displaced transmission surfaces less than or equal to 25 nm.

* * * * *

UNITED STATES PATENT AND TRADEMARK OFFICE
CERTIFICATE OF CORRECTION

PATENT NO. : 8,517,545 B2  Page 1 of 1
APPLICATION NO. : 12/736056
DATED : August 27, 2013
INVENTOR(S) : Quenzer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 382 days.

Signed and Sealed this
Fifteenth Day of September, 2015

Michelle K. Lee
*Director of the United States Patent and Trademark Office*